United States Patent
Queck et al.

(10) Patent No.: US 8,101,039 B2
(45) Date of Patent: Jan. 24, 2012

(54) MANUFACTURING OF PHOTOVOLTAIC SUBASSEMBLIES

(75) Inventors: Curtis L. Queck, Spring Green, WI (US); Jacobus P. C. Pretorius, Lone Rock, WI (US); Robert C. Buchanan, Spring Green, WI (US); Robert C. Grommesh, St. Louis Park, MN (US)

(73) Assignee: Cardinal IG Company, Eden Prairie, MN (US)

( * ) Notice: Subject to any disclaimer, the term of this patent is extended or adjusted under 35 U.S.C. 154(b) by 432 days.

(21) Appl. No.: 12/337,441

(22) Filed: Dec. 17, 2008

(65) Prior Publication Data

US 2009/0255627 A1    Oct. 15, 2009

Related U.S. Application Data

(63) Continuation-in-part of application No. 12/167,826, filed on Jul. 3, 2008, now abandoned.

(60) Provisional application No. 61/043,908, filed on Apr. 10, 2008.

(51) Int. Cl.
*B29C 65/00* (2006.01)
*B32B 37/00* (2006.01)
*B32B 38/04* (2006.01)

(52) U.S. Cl. ........ 156/270; 156/101; 156/106; 156/107; 156/145; 156/276; 156/383; 156/514; 156/522; 156/552; 156/256

(58) Field of Classification Search .................. 156/101, 156/106, 107, 145, 253, 270, 276, 383, 514, 156/522, 552, 256

See application file for complete search history.

(56) References Cited

U.S. PATENT DOCUMENTS

| | | | |
|---|---|---|---|
| 2,303,897 A | 12/1942 | Smith | |
| 3,037,897 A * | 6/1962 | Pelley | 156/78 |
| 3,473,988 A | 10/1969 | Rullier | |
| 3,531,346 A | 9/1970 | Jameson | |
| 3,758,996 A | 9/1973 | Bowser | |
| 3,780,424 A | 12/1973 | Forestieri | |
| 3,791,910 A | 2/1974 | Bowser | |

(Continued)

FOREIGN PATENT DOCUMENTS

DE     3801989 A1    7/1989
(Continued)

OTHER PUBLICATIONS

Tarrant et al., "Thin-Film Photovoltaic Partnership—CIS-Based Thin Film PV Technology—Final Technical Report—Sep. 1995-Dec. 1998" National Renewable Energy Laboratory, 66 pages.

(Continued)

*Primary Examiner* — Linda L Gray
(74) *Attorney, Agent, or Firm* — Fredrikson & Byron, P.A.

(57) ABSTRACT

Some methods, and corresponding apparatus, for manufacturing photovoltaic subassemblies cause a plurality of desiccant beads to be adhered to an adhesive surface of sheet-like material; the sheet-like material is then, preferably, adhered to an exposed surface of a flexible and electrically non-conductive film, that covers a photovoltaic coating of a first substrate of the subassembly, such that the desiccant beads are held between the sheet-like material and the exposed surface. Some other methods, either alternatively or in addition to the above, include steps for applying the film, that covers the photovoltaic coating, wherein an opening, through the film, is cut, and then aligned, with lead wires of the photovoltaic coating, in the midst of applying the film.

43 Claims, 11 Drawing Sheets

U.S. PATENT DOCUMENTS

| | | | |
|---|---|---|---|
| 3,822,172 | A | 7/1974 | Rullier |
| 3,876,489 | A | 4/1975 | Chenel |
| 3,957,537 | A | 5/1976 | Baskett |
| 3,974,011 | A | 8/1976 | Jarchow |
| 4,014,733 | A | 3/1977 | Loubet |
| 4,085,238 | A | 4/1978 | Chenel |
| 4,088,522 | A | 5/1978 | Mercier |
| 4,110,148 | A | 8/1978 | Rocholl |
| 4,120,999 | A | 10/1978 | Chenel |
| 4,145,237 | A | 3/1979 | Mercier |
| 4,186,685 | A | 2/1980 | Chenel |
| 4,193,236 | A | 3/1980 | Mazzoni |
| 4,198,254 | A | 4/1980 | Laroche |
| 4,205,104 | A | 5/1980 | Chenel |
| 4,226,063 | A | 10/1980 | Chenel |
| 4,233,796 | A | 11/1980 | Mazzoni |
| 4,234,372 | A | 11/1980 | Bernhard |
| 4,249,958 | A | 2/1981 | Baudin |
| 4,295,914 | A | 10/1981 | Checko |
| 4,295,920 | A | 10/1981 | Bovone |
| 4,434,024 | A | 2/1984 | Lisec |
| 4,519,962 | A | 5/1985 | Schlienkamp |
| 4,546,723 | A | 10/1985 | Leopold |
| 4,559,001 | A | 12/1985 | Wiedenhofer |
| 4,561,929 | A | 12/1985 | Lenhardt |
| 4,622,249 | A | 11/1986 | Bowser |
| 4,629,820 | A | 12/1986 | Basol |
| 4,633,032 | A | 12/1986 | Oido |
| 4,663,228 | A | 5/1987 | Bolton |
| 4,668,574 | A | 5/1987 | Bolton |
| 4,696,256 | A | 9/1987 | Lenhardt |
| 4,708,762 | A | 11/1987 | Lenhardt |
| 4,713,493 | A | 12/1987 | Ovshinsky |
| 4,726,875 | A | 2/1988 | Lenhardt |
| 4,807,419 | A | 2/1989 | Hodek |
| 4,831,799 | A | 5/1989 | Glover |
| 4,832,755 | A | 5/1989 | Barton |
| 4,847,669 | A | 7/1989 | Yamazaki |
| 4,957,572 | A | 9/1990 | Dewitte |
| 4,964,362 | A | 10/1990 | Dominguez |
| 4,973,436 | A | 11/1990 | Lisec |
| 5,007,217 | A | 4/1991 | Glover |
| 5,022,930 | A | 6/1991 | Ackerman et al. |
| 5,033,249 | A | 7/1991 | Scheeren |
| 5,088,188 | A | 2/1992 | Riou |
| 5,120,584 | A | 6/1992 | Ohlenforst |
| 5,128,181 | A | 7/1992 | Kunert |
| 5,136,974 | A | 8/1992 | Lisec |
| 5,213,627 | A | 5/1993 | Marquardt |
| 5,254,179 | A | 10/1993 | Ricaud |
| 5,273,593 | A | 12/1993 | Marquardt |
| 5,273,608 | A * | 12/1993 | Nath ........................... 156/301 |
| 5,368,654 | A | 11/1994 | Bergevin |
| 5,436,040 | A | 7/1995 | LaFond |
| 5,441,779 | A | 8/1995 | LaFond |
| 5,460,660 | A | 10/1995 | Albright |
| 5,472,910 | A | 12/1995 | Johnson |
| 5,476,553 | A | 12/1995 | Hanoka |
| 5,478,402 | A | 12/1995 | Hanoka |
| 5,508,205 | A | 4/1996 | Dominguez |
| 5,554,325 | A | 9/1996 | Kotte |
| 5,650,029 | A | 7/1997 | Lafond |
| 5,667,595 | A | 9/1997 | Vaverka |
| 5,679,419 | A | 10/1997 | Larsen |
| 5,733,382 | A | 3/1998 | Hanoka |
| 5,741,370 | A | 4/1998 | Hanoka |
| 5,762,720 | A | 6/1998 | Hanoka |
| 5,840,794 | A | 11/1998 | Palmer |
| 5,888,341 | A | 3/1999 | Lafond |
| 5,957,169 | A | 9/1999 | Trpkovski |
| 5,961,759 | A | 10/1999 | Schubert |
| 5,986,203 | A | 11/1999 | Hanoka |
| 6,030,475 | A | 2/2000 | Spotts, Jr. |
| 6,033,200 | A | 3/2000 | Fox |
| 6,077,722 | A | 6/2000 | Jansen |
| 6,081,071 | A | 6/2000 | Rogers |
| 6,105,336 | A | 8/2000 | Katoh |
| 6,111,189 | A | 8/2000 | Garvison |
| 6,114,046 | A | 9/2000 | Hanoka |
| 6,121,541 | A | 9/2000 | Arya |
| 6,148,890 | A | 11/2000 | Lafond |
| 6,187,448 | B1 | 2/2001 | Hanoka |
| 6,197,231 | B1 | 3/2001 | Lisec |
| 6,226,890 | B1 | 5/2001 | Boroson |
| 6,235,356 | B1 | 5/2001 | Shibuya |
| 6,238,755 | B1 | 5/2001 | Harvey |
| 6,245,262 | B1 | 6/2001 | Varaprasad |
| 6,287,943 | B1 | 9/2001 | Fujioka et al. |
| 6,288,325 | B1 | 9/2001 | Jansen |
| 6,319,596 | B1 | 11/2001 | Kernander |
| 6,320,116 | B1 | 11/2001 | Hanoka |
| 6,353,042 | B1 | 3/2002 | Hanoka |
| 6,368,892 | B1 | 4/2002 | Arya |
| 6,369,316 | B1 | 4/2002 | Plessing |
| 6,378,586 | B1 | 4/2002 | Lafond |
| 6,410,843 | B1 | 6/2002 | Kishi |
| 6,420,646 | B2 | 7/2002 | Benz |
| 6,444,281 | B1 | 9/2002 | Wang |
| 6,457,294 | B1 | 10/2002 | Virnelson |
| 6,462,266 | B1 | 10/2002 | Kurth |
| 6,465,724 | B1 | 10/2002 | Garvison |
| 6,491,966 | B1 | 12/2002 | Lisec |
| 6,494,245 | B1 | 12/2002 | Simone |
| 6,551,715 | B1 | 4/2003 | Seto |
| 6,552,118 | B2 | 4/2003 | Fujita |
| 6,554,043 | B2 | 4/2003 | Simone |
| 6,586,271 | B2 | 7/2003 | Hanoka |
| 6,630,028 | B2 | 10/2003 | Briese |
| 6,657,119 | B2 | 12/2003 | Lindquist |
| 6,660,930 | B1 | 12/2003 | Gonsiorawski |
| 6,673,436 | B2 | 1/2004 | Kawaguchi et al. |
| 6,673,997 | B2 | 1/2004 | Blieske |
| 6,701,749 | B2 | 3/2004 | Wang |
| 6,784,361 | B2 | 8/2004 | Carlson |
| 6,822,157 | B2 | 11/2004 | Fujiyoka |
| 6,858,461 | B2 | 2/2005 | Oswald |
| 6,861,802 | B2 | 3/2005 | Hishida |
| 6,871,419 | B1 | 3/2005 | Becker |
| 6,913,943 | B2 | 7/2005 | Cunningham |
| 6,926,782 | B2 | 8/2005 | McGlinchy |
| 7,026,397 | B2 | 4/2006 | Hasegawa |
| 7,033,655 | B2 | 4/2006 | Beteille |
| 7,071,018 | B2 | 7/2006 | Mason |
| 7,115,695 | B2 | 10/2006 | Okamoto |
| 7,186,780 | B2 | 3/2007 | Hasegawa |
| 7,202,410 | B2 | 4/2007 | Umemoto |
| 7,259,321 | B2 | 8/2007 | Oswald |
| 7,306,346 | B2 | 12/2007 | Fukuoka |
| 7,306,833 | B2 | 12/2007 | Martin |
| 7,333,916 | B2 | 2/2008 | Warfield |
| 7,347,909 | B2 | 3/2008 | Reichert |
| 7,357,169 | B2 | 4/2008 | Vianello |
| 7,402,448 | B2 | 7/2008 | Narayanan |
| 2001/0054436 | A1 | 12/2001 | Mukai |
| 2002/0153038 | A1 | 10/2002 | Umemoto |
| 2003/0000568 | A1 | 1/2003 | Gonsiorawski |
| 2003/0010378 | A1 | 1/2003 | Yoda |
| 2003/0029493 | A1 | 2/2003 | Plessing |
| 2003/0070706 | A1 | 4/2003 | Fujioka |
| 2003/0079772 | A1 | 5/2003 | Gittings |
| 2003/0116185 | A1 | 6/2003 | Oswald |
| 2004/0144415 | A1 | 7/2004 | Arhart |
| 2004/0182493 | A1 | 9/2004 | Chick |
| 2004/0185195 | A1 | 9/2004 | Anderson |
| 2004/0202803 | A1 | 10/2004 | Hoover |
| 2005/0014912 | A1 | 1/2005 | Hirota |
| 2005/0074917 | A1 | 4/2005 | Mason |
| 2005/0279401 | A1 | 12/2005 | Arhart |
| 2005/0284516 | A1 | 12/2005 | Koll |
| 2006/0079645 | A1 | 4/2006 | Hasegawa |
| 2006/0096632 | A1 | 5/2006 | Oswald |
| 2006/0135709 | A1 | 6/2006 | Hasegawa |
| 2006/0165929 | A1 | 7/2006 | Lenges |
| 2006/0173121 | A1 | 8/2006 | Tamai |
| 2006/0205887 | A1 | 9/2006 | Nakagawa |
| 2006/0247376 | A1 | 11/2006 | Hasegawa |
| 2006/0252903 | A1 | 11/2006 | Waklabayashi |

| | | | |
|---|---|---|---|
| 2007/0006913 | A1 | 1/2007 | Romero |
| 2007/0012352 | A1 | 1/2007 | Wohlgemuth |
| 2007/0021563 | A1 | 1/2007 | Kasai |
| 2007/0079865 | A1 | 4/2007 | Warfield |
| 2007/0116907 | A1 | 5/2007 | Landon |
| 2007/0122572 | A1 | 5/2007 | Shibuya |
| 2007/0122633 | A1 | 5/2007 | Pesek |
| 2007/0137692 | A1 | 6/2007 | Carlson |
| 2007/0144578 | A1 | 6/2007 | Cunningham |
| 2007/0160781 | A1 | 7/2007 | Landon |
| 2007/0167583 | A1 | 7/2007 | Yano |
| 2007/0178256 | A1 | 8/2007 | Landon |
| 2007/0178257 | A1 | 8/2007 | Landon |
| 2007/0237912 | A1 | 10/2007 | Correia |
| 2007/0295390 | A1 | 12/2007 | Sheats |
| 2007/0295399 | A1 | 12/2007 | Carlson |
| 2008/0000195 | A1 | 1/2008 | Clarahan |
| 2008/0033087 | A1 | 2/2008 | Okamoto |
| 2008/0035140 | A1 | 2/2008 | Placer |
| 2008/0035196 | A1 | 2/2008 | Monus |
| 2008/0041434 | A1 | 2/2008 | Adriani |
| 2008/0053516 | A1 | 3/2008 | Hayes |
| 2008/0105303 | A1 | 5/2008 | Oswald |
| 2008/0115822 | A1 | 5/2008 | Cunningham |
| 2008/0171780 | A1 | 7/2008 | Singh |
| 2008/0178928 | A1 | 7/2008 | Warfield |
| 2008/0210287 | A1 | 9/2008 | Volpp |
| 2008/0216893 | A1 | 9/2008 | Russell |
| 2008/0236654 | A1 | 10/2008 | Pietrangelo |
| 2008/0245405 | A1 | 10/2008 | Garvison |
| 2008/0264484 | A1 | 10/2008 | Temchenko |

FOREIGN PATENT DOCUMENTS

| | | |
|---|---|---|
| EP | 0845816 | 6/1998 |
| EP | 1020930 A1 | 7/2000 |
| EP | 1642932 | 4/2006 |
| EP | 1657155 | 5/2006 |
| EP | 1712588 | 10/2006 |
| GB | 1524848 | 9/1978 |
| GB | 2031224 | 4/1980 |
| GB | 2078129 A | 1/1982 |
| JP | 10299353 A | 11/1998 |
| JP | 11340494 | 12/1999 |
| JP | 2005281073 | 10/2005 |
| WO | W00159011 | 8/2001 |
| WO | W00262716 | 8/2002 |
| WO | W002/068482 | 9/2002 |
| WO | W003/000749 | 1/2003 |
| WO | W003/033546 | 4/2003 |
| WO | 03/050891 A | 6/2003 |
| WO | W02004074381 | 9/2004 |
| WO | W02004090035 | 10/2004 |
| WO | W02004106400 | 12/2004 |
| WO | W02004113450 | 12/2004 |
| WO | W02006/106844 | 10/2006 |
| WO | W02009013308 | 1/2009 |
| WO | W02009036752 | 3/2009 |

OTHER PUBLICATIONS

Glass et al., "Development and Evaluation of Sealing Technologies for Photovoltaic Panels", Sandia National Laboratories, 1998, 62 pages.
"Photovolatic Insulation Glass", Photon International, Jul. 2007, pp. 26-34.
Weisiger et al., Cadmium Telluride Photovoltaic Manufacturing Technology—Annual Subcontract Report—Jan. 7, 1994-Jan. 6, 1995, 41 pages.
International Search Report and Written Opinion, dated Jan. 13, 2009 for PCT Application No. PCT/US2008/069175, 8 pages.
International Search Report, dated May 11, 2008 for PCT Application No. PCT/US2008/071176, 4 pages.
Utility U.S. Appl. No. 12/167,826, filed Jul. 3, 2008.
International Search Report and Written Opinion, dated May 27, 2009 for PCT Application No. PCT/US2008/087248, 13 pages.
Photocap Solar Cell Encapsulants—Technical Manual, Specialized Technology Resources, Inc., 26 pages.
Alphonsus Pocius, Adhesion and Adhesives Technology: an Introduction, 1997, pp. 216-220, and 248-253.
DuPont Glass Laminating Products, Section 6 and 8, Jun. 2005, 45 pages.
G. Friesen, et al., Temperature Behavior of Photovoltaic Parameters, European Solar Test Insulation/EC, Ispra, Italy.
David L. King, et al. Temperature Coefficients for PV Modules and Arrays: Measurement Methods, Difficulties and Results, 26th IEEE Photovoltaic Specialists Conference, Sep. 29-Oct. 3, 1997, Anaheim, California.
English-language abstract for JP11340494 (Matsushita Electric).
Rooney et al., "Failure Analysis of Die Bond Adhesion Failures Caused by Silicone Contamination", Oneida Research Services, Inc., Whitesboro, NY, 10 pages.
Tamai et al., "Effect of Switching Rate on Contact Failure From Contact Resistance of Micro Relay Under Environment Containing Silicone Vapor", IEEE Xplore, Oct. 7, 2008, pp. 333-339.
Woods, et al., "Atmospheric Pressure Chemical Vapor Deposition and Jet Vapor Deposition of CdTe for High Efficiency Thin Film PV Devices—Final Technical Report", National Renewable Energy Laboratory, Jan. 26, 2000-Aug. 15, 2002.
Pern, F.J., et al., Conference Paper entitled: "Enhanced Adhesion of EVA Laminates to Primed Glass Substrates Subjected to Damp Heat Exposure", NREL/CP-520-37391, Feb. 2005, Contract No. DE-AC36-99-GO10337.
Shepard, Nick E., et al., "A Simple Device for Measuring Adhesive Failure in Sealant Joints", Science and Technology of Building Seals, Sealants, Glazing, and Waterproofing: Seventh Volume, 1998, ASTM Stock #STP1334.
Gelest Inc., "Applying Silanes", Silicon Compounds: Silanes and Silicones a Survey of Properties and Chemistry, 2nd Edition, p. 184, Copyright 2008 (www.gelest.com).
DuPONT, "DuPontTM SentryGlas(R) Plus, Architectural Safety Glass Interlayer", 2008, pp. 1-7.
Applying a Silane Coupling Agent, 4 pages.
TPS® multilayer application, Bystronic Glass, http://www.bystronic.com/global/com/en/solar_technology/back_end/multilayer.php, including video: TPS® multilayer application, printed, Aug. 13, 2009, 2 pages.
"Manufacturing Options for Large A-Si PV Façade Elelements", 2nd World Conference and Exhibition on Photovoltaic Solar Energy Conversion, Jul. 6-10, 1998, Vienna, Austria.
English-language abstract for WO2009036752 (Koemmerling Chem Fab GmbH).

* cited by examiner

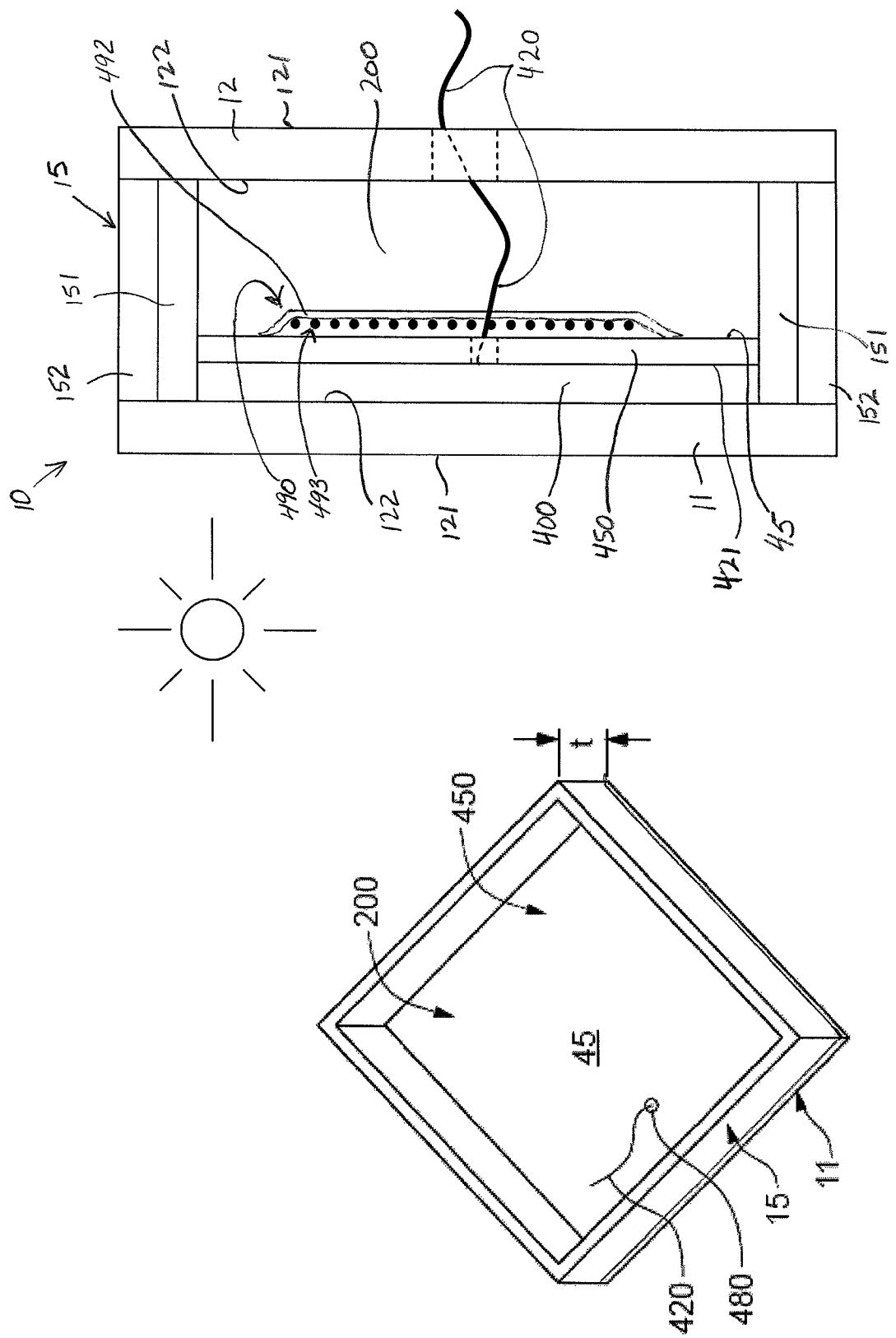

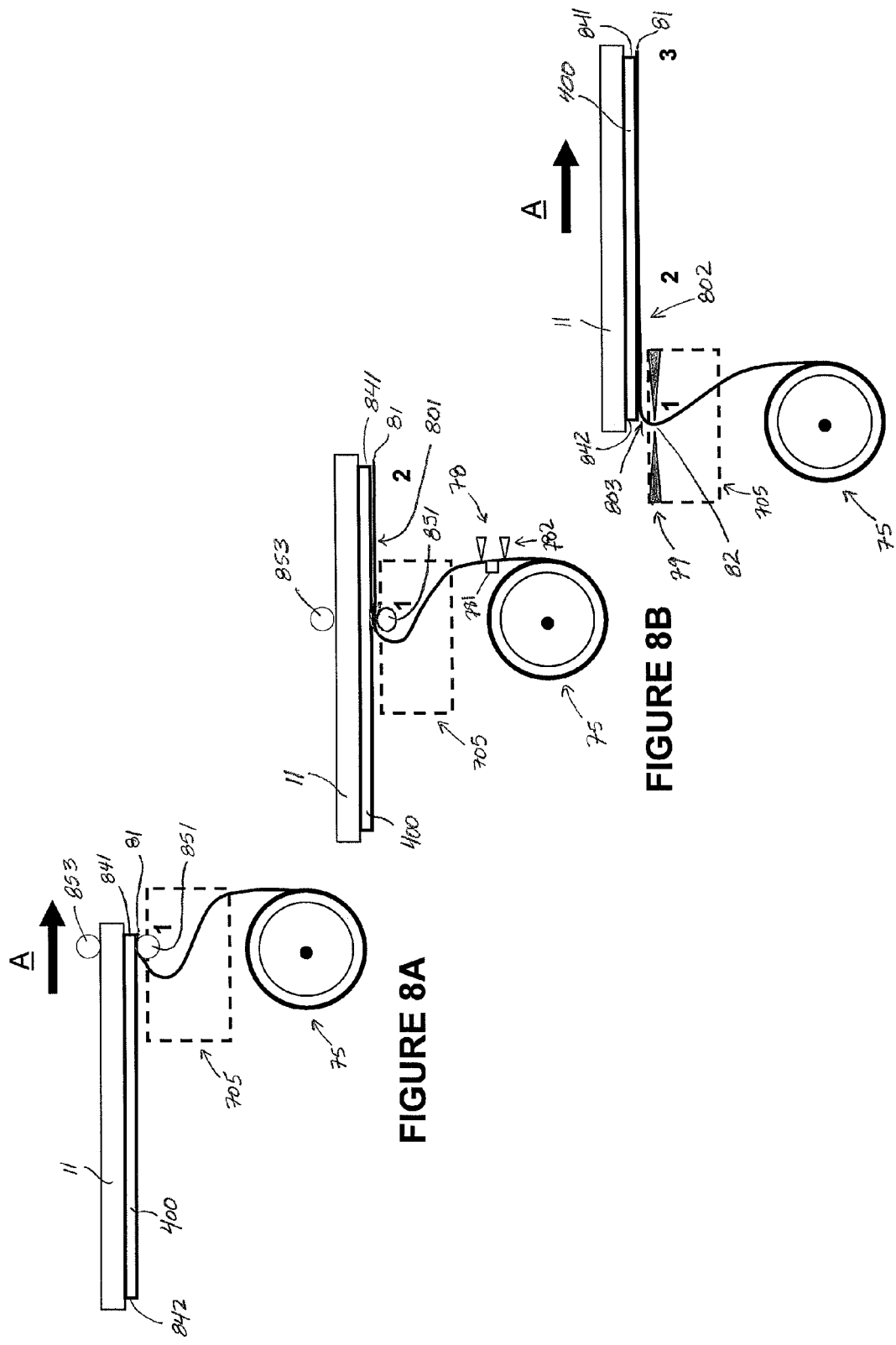

MANUFACTURING OF PHOTOVOLTAIC SUBASSEMBLIES

RELATED APPLICATIONS

The present application is a continuation-in-part of the application entitled: GLAZING ASSEMBLIES THAT INCORPORATE PHOTOVOLTAIC ELEMENTS AND RELATED METHODS OF MANUFACTURE, which has the Ser. No. 12/167,826, and was filed on Jul. 3, 2008, now abandoned, and which claims priority to the provisional application having the Ser. No. 61/043,908 and being filed on Apr. 10, 2008, both of which are hereby incorporated by reference, in their entireties.

TECHNICAL FIELD

The present invention pertains to manufacturing methods and equipment for glazing assemblies, and the like, which incorporate photovoltaic elements. Such assemblies, in the solar cell industry, may be more commonly known, or referred to, as solar or photovoltaic modules or assemblies.

BACKGROUND

Insulating glass (IG) units are glazing assemblies that typically include at least a pair of panels, or substrates, joined together such that a major surface of one of the substrates faces a major surface of the other of the substrates, and an air space is enclosed between the two substrates. At least one of the substrates is transparent, or light transmitting, and may bear a coating on the major surface that faces the major surface of the other substrate.

With the recent renewed interest in harnessing solar power, and the associated development of photovoltaic coatings for solar power cells, various configurations of assemblies that incorporate photovoltaic coatings, have been proposed. These assemblies, when configured like IG units, may be more cost effective than traditional laminated solar panels, for example, in that a bulk of the material (e.g. EVA), which encapsulates the photovoltaic coating, in the traditional solar panel, is replaced with an air space, thereby reducing material cost and manufacturing time, per unit. There is still a need for improved methods and equipment for manufacturing assemblies, which effectively incorporate photovoltaic coatings, in order to generate solar power.

BRIEF SUMMARY

Methods of the present invention may be used to manufacture photovoltaic subassemblies for integration into assemblies, particularly IG unit-type assemblies. The methods described herein are preferably suited for mass production of assemblies in an automated, or semi-automated assembly line.

Some of the inventive methods, disclosed herein, include steps for applying a flexible and non-electrically conductive film over a photovoltaic coating of a first substrate, and cutting, and then aligning, with lead wires of the photovoltaic coating, an opening, through the film, in the midst of applying the film. Some other methods of the present invention, alternatively, or in addition, include steps in which desiccant beads are adhered to an adhesive surface of sheet-like material, to form at least one desiccant sheet, and, then, the adhesive surface is adhered to the first substrate, such that the desiccant beads are held between the sheet-like material and the photovoltaic coating of the first substrate. According to some preferred methods of the present invention, the desiccant sheet is adhered to an exposed surface of the film which was previously applied over the photovoltaic coating, such that the beads are held between the sheet-like material and the film. Methods of the present invention further include those in which desiccant sheets are formed by causing a plurality of desiccant beads to ricochet from a plurality of deflectors in order to bombard the adhesive surface of each discrete section of the sheet-like material; the discrete sections are preferably drawn, from a continuous roll of the sheet-like material, face-to-face with the deflectors for the bombardment with the desiccant beads. Forming of the desiccant sheets, according to some preferred methods of the invention, takes place in an assembly line workstation, which also applies the sheets to each first substrate that enters the workstation.

The present disclosure further includes inventive manufacturing apparatus embodiments that may be included in an assembly line to carry out methods of the present invention. According to some embodiments of the present invention, a manufacturing apparatus includes means for forming desiccant sheets from a continuous roll of sheet-like material, for example, according to the method, which is outlined in the latter portion of the preceding paragraph.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the present invention will hereinafter be described in conjunction with the appended drawings, wherein like numerals denote like elements.

FIG. 3 is a perspective view of a portion of the assembly shown in FIG. 1.

FIG. 4 is a cross-section view through section line A-A of FIG. 1.

FIGS. 8A-C make up a series of schematics, which depict some of the steps of a method carried out by the workstation of FIGS. 7A-B.

DETAILED DESCRIPTION

The following detailed description is exemplary in nature and is not intended to limit the scope, applicability, or configuration of the invention in any way. Rather, the following description provides practical illustrations for implementing exemplary embodiments of the present invention.

Figure 2:
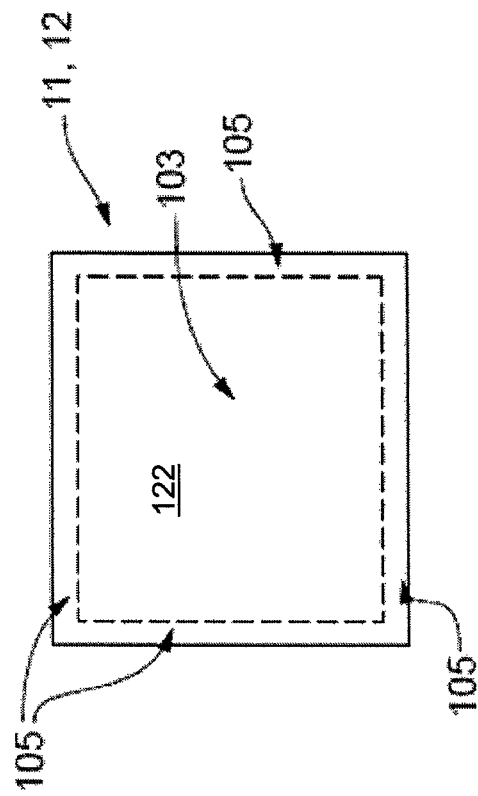
FIG. 2 is a schematic plan view of either of the substrates of the assembly shown in FIG. 1.
Figure 1:
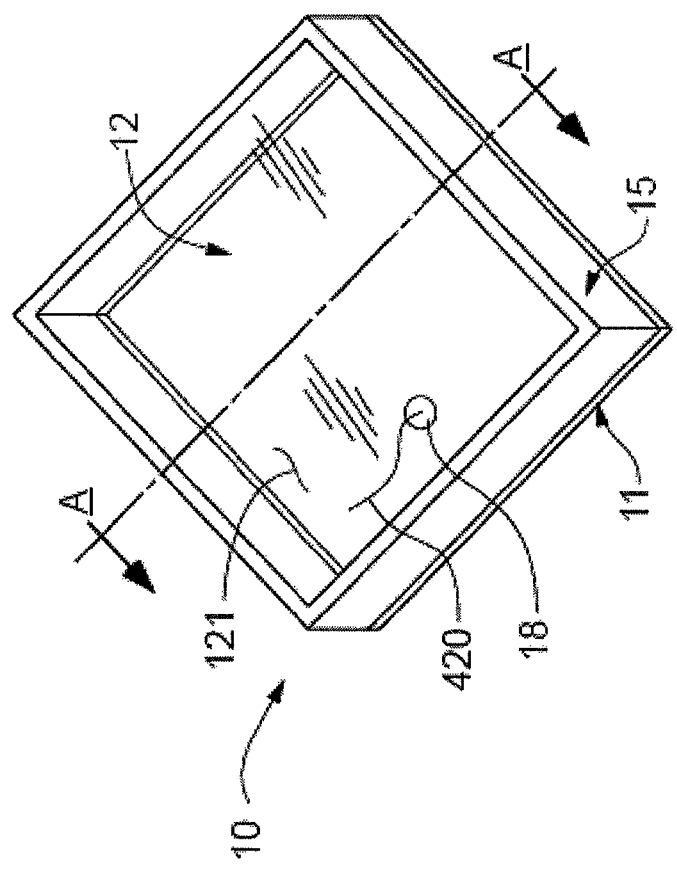
FIG. 1 is a perspective view of an exemplary IG-unit type assembly.

FIG. 1 is a perspective view of an exemplary IG-unit type assembly 10. FIG. 1 illustrates assembly 10 including a first substrate 11, a second substrate 12 and a seal system 15, which joins substrates 11, 12 together; a first major surface 121 of each of substrates 11, 12, face outward or away from one another, and a second major surface 122 of each of substrates 11, 12 faces inward, or toward one another, being spaced apart from one another by a seal system 15. FIG. 2 is a schematic plan view of either of the substrates 11, 12 of assembly 10. FIG. 2 illustrates second, or inner major surface 122 of substrate 11, 12 having a central region 103 and a peripheral region 105, which are delineated from one another by the dashed line. According to the illustrated embodiment, seal system 15 joins first substrate 11 to second substrate 12 along peripheral regions 105 of inner major surfaces 122. FIG. 3 is a perspective view of assembly 10, having second substrate 12 removed to show an air space 200 that is enclosed between substrates 11, 12 when they are joined together by seal system 15.

FIG. 3 further illustrates seal system 15 having a thickness t, so as to maintain airspace 200; thus, seal system 15 further serves as a spacer member between substrates 11, 12. According to some embodiments, thickness t is between approximately 0.01 inch and approximately 0.1 inch, preferably approximately 0.04 inch, but could be up to 1.5 inches in alternate embodiments. According to some embodiments, seal system 15 is formed, at least in part, from a polymer material, for example, a thermoplastic, such as a Kommerling TPS, having low moisture vapor transmission properties, for example, resulting in a moisture vapor transmission rate (MVTR) therethrough, which does not exceed approximately 20 g mm/m$^2$/day. Other examples of these polymer materials include, without limitation, butyl rubber, ionomers, ethylene methacrylic acid copolymers and polyisobutylenes, the ethylene methacrylic acid copolymers being preferred for their excellent adhesion properties, which are desirable to hold together assemblies such as assembly 10. Some examples of these preferred materials, which are commercially available, are Sentry Glas®Plus, available from DuPont, and PRIMACOR™, available from Dow Chemical.

According to some preferred embodiments, seal system 15 includes a first member 151, which extends along an inner portion of peripheral region 105, and a second member 152, which extends about an external perimeter of first member 151, along an outer portion of perimeter region 105, for example as illustrated in FIG. 4. FIG. 4 is a section view through section line A-A of FIG. 1. With reference to FIG. 4, first member 151 may be affixed to opposing peripheral regions 105 of inner major surfaces 122 of substrates 11, 12, in order to join substrates 11, 12 to one another, leaving an outer perimeter channel between the outer portions of the opposing peripheral regions 105 to be later filled with second member 152. First member 151 is preferably formed from a polymer material, which has low moisture vapor transmission properties, for example, any of those referenced above; and second member 152 may be formed of any material having suitable adhesive properties, for example, silicone, polysulfide or polyurethane. Some commercially available silicone adhesives, which are suitable for second member 152, include, without limitation, 3-0117 silicone insulating sealant and 995 silicone structural sealant from Dow Corning, IGS 3729 sealant from Momentive Performance Materials (formerly GE Silicones), and SikaGlaze® sealants (IG-16, IG-25 and IG 25HM) from the Sika Corporation. Both members 151, 152 preferably provide for sealing and adhesion between substrates 11, 12, and at least first member 151 also serves as a spacer member, but, according to some alternate embodiments, first member 151 may serve solely as a spacer member and second member 152 solely as a sealing and adhesive member.

According to some preferred embodiments, first substrate 11 is light transmitting, for example, formed from glass or a plastic material, such as polycarbonate, and second substrate 12 may be similarly formed or may be opaque. According to some alternate embodiments, second substrate is light transmitting, for example, formed from glass or a plastic material, such as polycarbonate, and first substrate 11 may be similarly formed or may be opaque. FIG. 4 further illustrates assembly 10 including a photovoltaic coating 400 extending over, and being adhered to, inner major surface 122 of first substrate 11, and a flexible and electrically non-conductive film 450 extending over photovoltaic coating 400, such that coating 400 is sandwiched between substrate 11 and film 450, and airspace 200 is located between an exposed surface 45 of film 450 and second substrate 12.

Film 450 may be formed, preferably pre-formed, prior to application over coating 400, from a polyolefin material, for example, a polyethylene or polypropylene, or from a polyester material, and may have a thickness between approximately 0.001 inch and approximately 0.015 inch, preferably approximately 0.0035 inch. According to some preferred embodiments, film 450, when pre-formed, includes an adhesive backing 421 for adhering film 450 to coating 400, and may be supplied in rolls. Adhesive backing 421 may be formed by an acrylic adhesive or by a rubber-based adhesive, or by any other suitable adhesive known to those skilled in the art, and may extend over approximately an entirety of the interface between film 450 and coating 400 or just over selected portions of the interface. Alternatively, film 450 may be otherwise secured over coating 400, for example, a perimeter of film 450 may be captured between a portion of seal system 15 and first substrate 11. It should be noted that film 450 may extend only over coating 400, or may significantly extend into peripheral region 105, even as far as to cover an entirety of major surface 122; alternatively, film 450 may leave some portions of coating 400 uncovered, for example, in close proximity to the perimeter edges thereof.

According to embodiments of the present invention, substrate 11, photovoltaic coating 400 and flexible and electrically non-conductive film 450 form a photovoltaic panel of assembly 10 so that assembly 10 can function as a solar power cell. Photovoltaic coating 400 may be of any type known to those skilled in the art, either of the conventional type, for example, including an array of silicon wafers interconnected by soldered conductors, or of the 'thin film' type, for example, including several thin film semiconductor layers, which are patterned to form electrically interconnected cells. An embodiment of the present invention, which includes coating 400 as a thin film CdTe type will be described, below, in conjunction with FIG. 5, however, it should be appreciated that alternate embodiments may incorporate coating 400 as a thin film Cu(InGa)Se$_2$ (CIGS) type or amorphous silicon(a-Si) type.

Because film 450 is enclosed between first and second substrates 11, 12 of assembly 10, film 450 need not have a durability that is otherwise required for exposed polymer back skins employed by some photovoltaic panels known in the art. However, according to some preferred embodiments, film 450 has properties such that the integrity of film 450 is maintained under thermal cycling conditions, for example, temperatures ranging between approximately −40° C. and approximately 85° C., over a life span of up to, and preferably exceeding, approximately 20 years.

With further reference to FIG. 4, according to some preferred embodiments, a desiccant sheet 490 is adhered to exposed surface 45 of film 450, within airspace 200, in order to absorb any moisture that may pass through seal system 15. Desiccant sheet 490 is formed from a sheet-like material 492 to which a plurality of desiccant beads 493 are adhered, such that beads 493 are held between sheet-like material 492 and exposed surface 45 of film 450. All, or portions of, surface 45 of film 450 may be treated to improve adhesion of sheet-like material 492 thereto, for example, by a plasma process such as a corona treatment, either prior to, or following, adhering film 450 to coating. Sheet-like material 492 allows moisture transmission therethrough, for absorption by desiccant beads 493, and may be formed of the same, or similar, material from which film 450 is formed. Sheet-like material 492 may be pre-formed with an adhesive backing, for example, as described above for film 450, and may be supplied in rolls. The size of the area of exposed surface 45 that desiccant sheet 490 covers is determined, in order to provide the desired moisture absorption for the particular assembly, according to a volume of air space 200, and a density of plurality of desiccant beads 493, for a particular type of desiccant sheet 490. According to an exemplary embodiment, approximately 50 grams of 3 A molecular sieve beaded desiccant, 0.8 mm to 1 mm in size, and having a minimum absorption capacity of 19%, by weight, is included for an airspace having a volume of approximately 720 cubic centimeters. The sheet-like material, to which this amount of beaded desiccant is adhered, is preferably a polyethylene film that includes an acrylic adhesive backing, and has a footprint of approximately 180 square inches (1150 cm$^2$). According to some preferred embodiments, plurality of beads 493 are adhered to a central region of sheet-like material 492, leaving a peripheral region free of beads for securing desiccant sheet 490 to surface 45.

According to some alternate embodiments, surface 45 of film 450 may include an adhesive layer such that desiccant beads 493 may be adhered directly thereto, with or without sheet-like material 492 extending over beads 493; or sheet-like material 492 may include an adhesive backing on both sides thereof, so that the side to which beads 493 are adhered faces outward from film 450 and the opposing side is adhered to surface 45 of film 450. According to yet further embodiments, desiccant sheet 490 is adhered to second substrate 12, or an alternative form of desiccant may be provided within airspace 200, for example, either embedded in a polymer matrix, or packaged in a sack, or 'free-floating' in airspace 200, or otherwise present in airspace 200. The desiccant material, according to any of the above-described embodiments, in combination with the aforementioned relatively low MVTR of seal system 15, may prevent moisture build-up within airspace 200 that can lead to corrosion of certain elements of photovoltaic coating 400.

Figure 5:
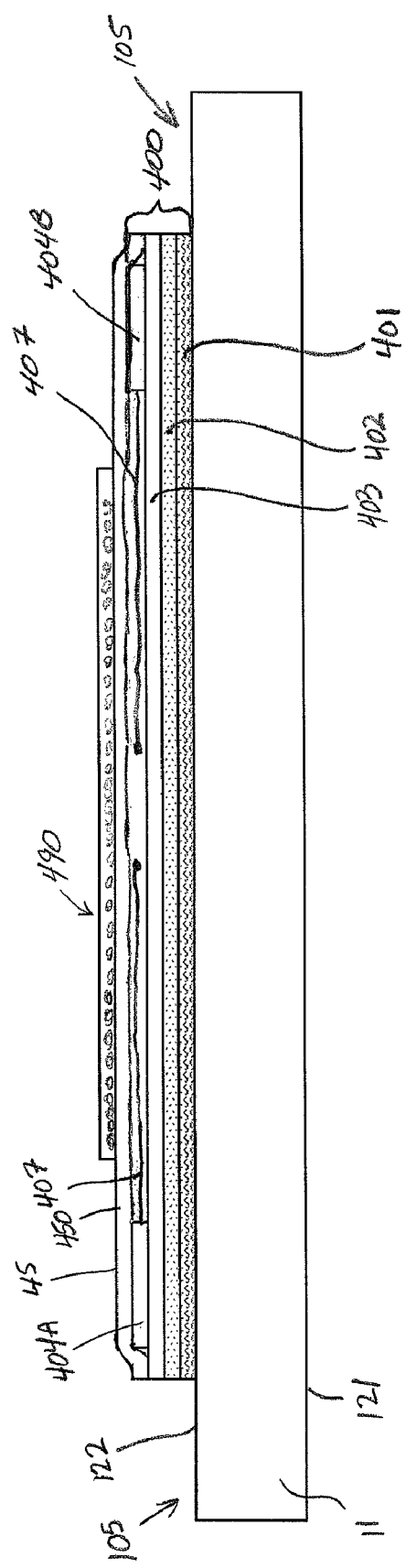
FIG. 5 is a cross-section of a portion of the assembly shown in FIG. 4, which may be assembled according to some methods of the present invention.

FIG. 5 is a cross-section of the photovoltaic panel portion of the assembly shown in FIG. 4, by which a non-limiting example of coating 400 is presented. FIG. 5 illustrates coating 400 including a first layer 401, which may be formed by a transparent conductive oxide (TCO), for example, comprising Tin oxide ($SnO_2$); first layer 401 may be overlaid with a semiconductor layer 402, for example, comprising two 'sub-layers': Cadmium sulfide (CdS; 'window' layer; n-type), extending adjacent to first layer 401, and Cadmium Telluride (CdTe; absorbing layer; p-type), overlaying the Cadmium sulfide sub-layer. FIG. 5 further illustrates an electrical contact layer 403, for example, comprising nickel, which extends between the Cadmium Telluride sub-layer of semiconductor layer 402, and a pair of bus bars 404A, 404B. Bus bars 404A, 404B may each be formed from a copper tape, for example, approximately 0.003-0.007 inch thick, which are adhered to contact layer 403, for example, by a conductive acrylic adhesive. Bus bars 404A, 404B preferably extend approximately parallel to one another along opposing edge portions of coating 400; an internal insulated conductor 407 is coupled to each bus bar 404A, 404B, and conductors 407 may terminate near an electrical access, or feedthrough, opening 480 in film 450 (FIG. 3). Film 450 can provide additional retention for holding bus bars 404A, 404B in intimate contact with contact layer 403 and for securing insulated conductors 407 against layer 400. An electrical lead 420, which is shown in FIGS. 1, 3 and 4, includes a pair of isolated conductive lead wires to collect power from the photovoltaic panel; each wire of lead 420 is coupled to a corresponding conductor 407, for example, via soldering to a respective terminal thereof in proximity to opening 480. If opening 480 is not provided, conductors 407 may terminate in proximity to a perimeter edge of film 450, for coupling to lead 420.

With reference to FIG. 1, second substrate 12 is shown including an opening 18, which may be approximately aligned with feedthrough opening 480, and extends through second substrate 12, to allow passage of lead 420 out from assembly 10. A diameter of openings 480, 18 may be between approximately ¼ inch and approximately 1 inch. According to the illustrated embodiment, after routing lead 420 out from system 10, through opening 18, a potting material is applied around lead 420, to seal off opening 18. Examples of suitable potting materials include, without limitation, polyurethane, epoxy, polyisobutylene, and any low MVTR material. According to alternate embodiments, opening 480 is not necessary, and lead 420 extends out from assembly 10 through an opening in seal system 15 or through an opening between seal system 15 and one of substrates 11, 12, or through an opening in first substrate 11.

According to some preferred embodiments of the present invention, the flexibility of film 450, in combination with a tear strength thereof, is suited to hold substrate 11 and photovoltaic coating 400 together, in case substrate 11 is fractured, thereby containing fragments of the fractured substrate 11 to prevent a scattering of potentially toxic elements of photovoltaic coating 400, for example, Cadmium. Furthermore, in the event that substrate 12 is broken, the electrical insulating property of film 450 preferably electrically isolates coating 400 and electrically charged conductors 407, which are coupled to bus bars 404A,B of coating 400, thereby preventing potential injury to one handling the broken assembly. Film 450 may further protect the semiconductor sub-layers of coating 400 if, for example, during relatively cold temperature conditions, the air space between substrates 11, 12 shrinks such that substrates 11, 12 come into contact. According to some embodiments, in which sun light is received by coating 400 through first substrate 11, for example, in the case of the CdTe type of coating (FIG. 5), and second substrate 12 is translucent or transparent, flexible film 450 is opaque to provide a more aesthetically pleasing uniform appearance to the photovoltaic panel, when viewed through second substrate 12. According to those embodiments in which coating 400 is the CIGS type, since sun light is received by the coating 400 through second substrate 12 and through film 450, film 450 needs to light transmitting.

Figure 6:
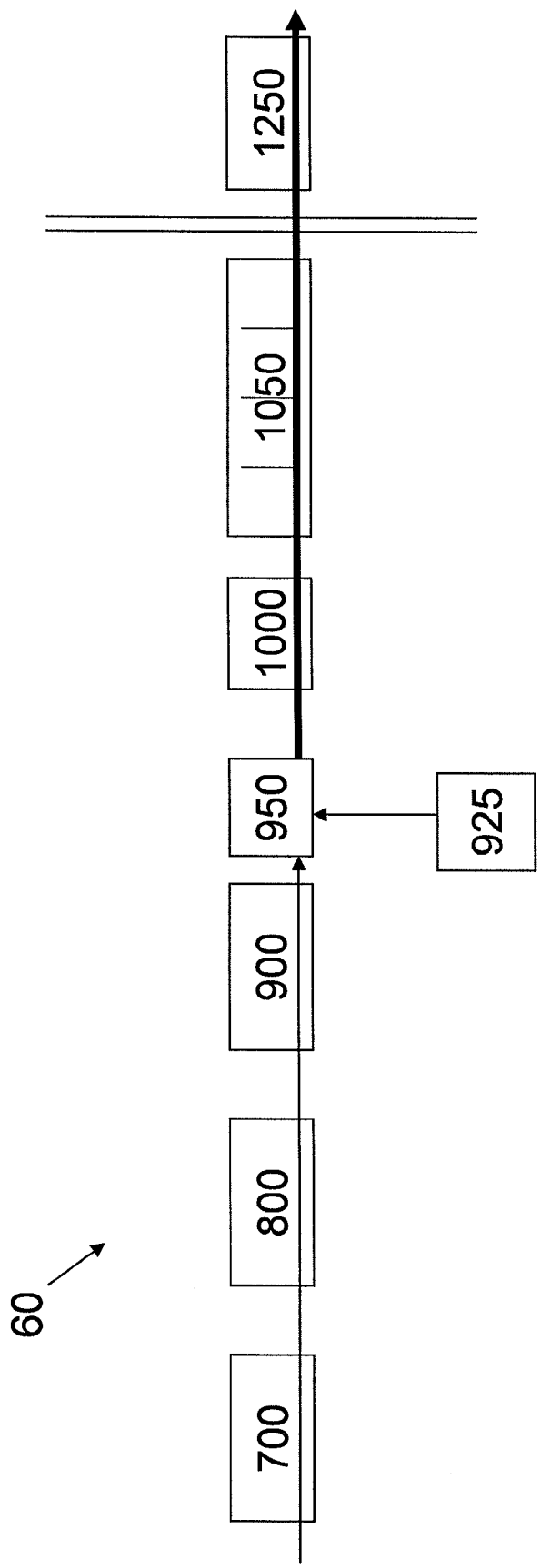
FIG. 6 is a schematic representation of an assembly line, according to some embodiments of the present invention.

FIG. 6 is a schematic layout for an assembly line 60, according to some embodiments, which carries out some methods of the present invention. Many or all of the workstations included in assembly line 60 may be automated, or semi-automated, to carry out some or all of the methods that are described below. FIG. 6 illustrates a flow of line 60 from left to right, but, it should be noted that, the flow could be in the opposite direction, according to alternate embodiments. It should be understood that a plurality of first substrates, which each have a photovoltaic coating pre-formed thereover, for example, like photovoltaic coating 400 (FIG. 4) formed over central region 103 of major surface 122 (FIG. 2) of first substrate 11, are fed sequentially into line 60, starting at a workstation 700. Each pre-formed photovoltaic coating preferably extends over the central region of the major surface of the corresponding first substrate, without significantly encroaching on a peripheral region of the surface, for example, region 105 (FIGS. 2 and 5), so as to maintain exposure of a native surface of each substrate for fixation to a corresponding sealing system, for example, sealing system 15. The sealing system, according to some preferred embodiments, serves as both a spacer, between substrates, and as a seal, having low moisture vapor transmission properties, for example, resulting in a moisture vapor transmission rate (MVTR) therethrough, which does not exceed approximately 20 g mm/m$^2$/day moisture, as described above. With reference to FIG. 6, a first member of the sealing system, for example, first member 151, as described above, is applied to each first substrate at a workstation 900, after a sheet of flexible and electrically non-conductive film, for example, film 450 (FIGS. 4-5), is overlaid onto the corresponding photovoltaic coating, at workstation 700, and after a desiccant sheet, for example, sheet 490 (FIGS. 4-5), is overlaid onto the corresponding film, at a workstation 800. Work stations 700 and 800 will be described in greater detail, below, in conjunction with FIGS. 7A-10.

FIG. 6 further illustrates a feeder station 925, which sequentially brings each of a plurality of second substrates, for example, like second substrate 12 (FIGS. 1, 2 and 4), to a station 950, where each second substrate is brought face-to-face with a corresponding first substrate, which has been processed in workstations 700, 800 and 900. At station 950, each pair of first and second substrates are brought face-to-face, such that a peripheral region of each is approximately aligned, with one another, and then each pair is conveyed, downstream, to a workstation 1000. Prior to bringing the substrates of each pair together, an opening, for example, opening 18 (FIG. 1), may be formed in the second substrate, for example, at station 925, or upstream thereof. If the opening is formed in each second substrate, the opening is preferably aligned with an opening in the film of the corresponding first substrate, for example, feedthrough opening 480 (FIG. 3), when the substrates are brought together.

At workstation 1000 each pair of first and second substrates is pressed together, for example, by confronting platens, with the first (spacer/seal) member sandwiched therebetween, so that the member extends along the peripheral regions of the facing major surfaces, while maintaining an air space, for example air space 200 (FIG. 4), between the central regions of the facing major surfaces of the first and second substrate pair. Although not necessary, heat may be applied, along with pressure, in workstation 1000, to securely affix the spacer/seal member to each of the substrates.

With further reference to FIG. 6, assembly line 60 includes a series of workstations 1050 that are located downstream of workstation 1000, where secondary processes, related to the photovoltaic coating of each assembly, are performed. For example, at a first of workstations 1050, an external lead is coupled to conductor wires of each photovoltaic coating. The lead may extend though an opening in second substrate, for example, like lead 420 (FIGS. 1, 3 and 4), as previously described. At a subsequent workstation of series 1050, a potting material is applied around the lead at the opening, to seal off the opening, as was also as previously described; the potting material may further form a strain relief for the lead adjacent to the second substrate, or a separate strain relief member may be installed about the lead. Workstations 1050 may further include one or more electrical test/inspection stations, for example, located downstream of that in which the potting material is applied.

Finally, a second member, for example, second member 152, of the seal system, for each assembly formed in line 60, is applied about an external perimeter of the first member, in between the first and second substrates, at a workstation 1250. According to some preferred embodiments, the second member is silicone adhesive, and FIG. 6 schematically illustrates a wall that separates workstation 1250 from the rest of assembly line 60, in order to isolate those assemblies, which are being processed upstream of workstation 1250, from potential silicone contamination.

Figure 7A:
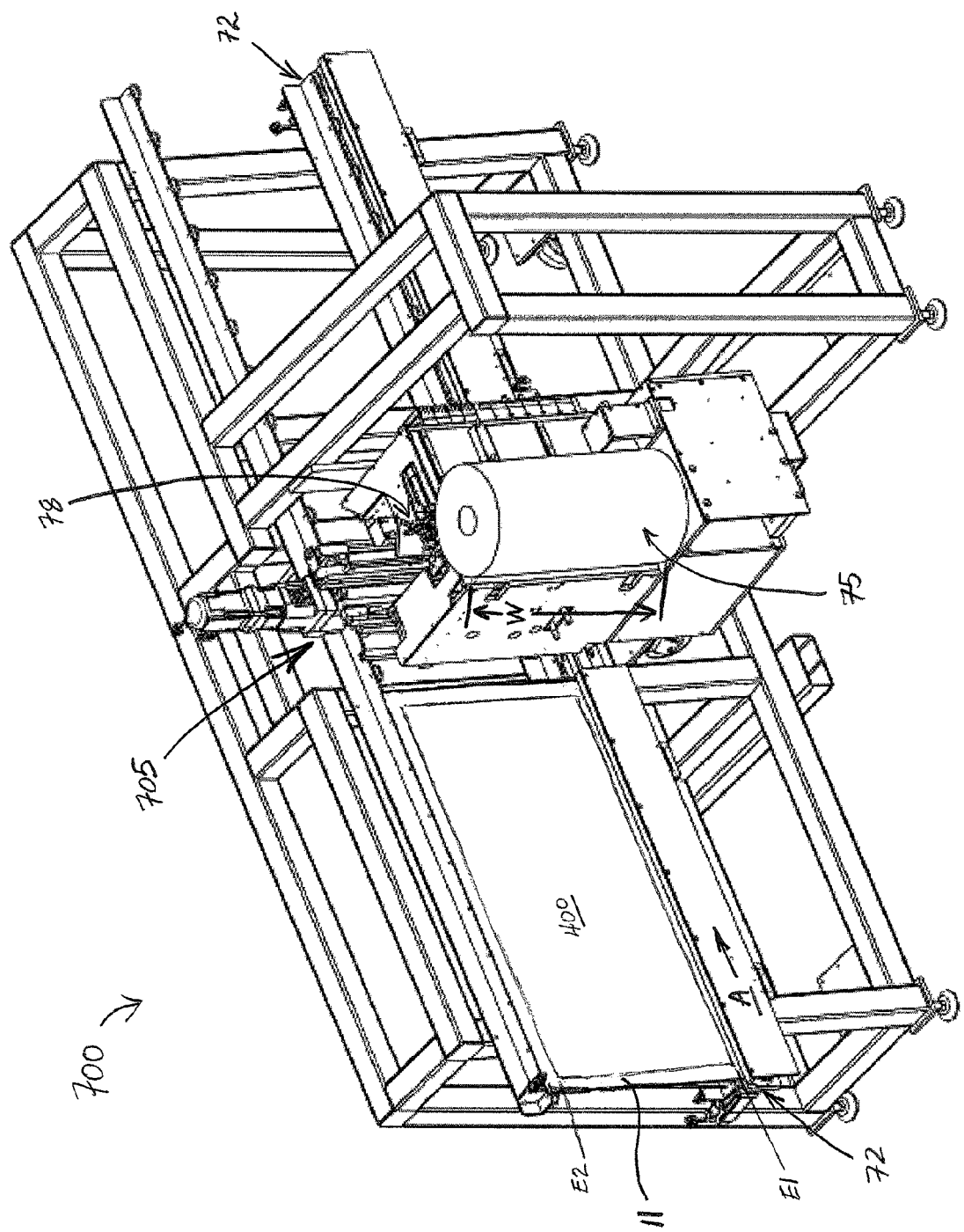
FIG. 7A is a perspective view of a workstation, which may be incorporated into the assembly line of FIG. 6, according to some embodiments of the present invention.
Figure 7B:
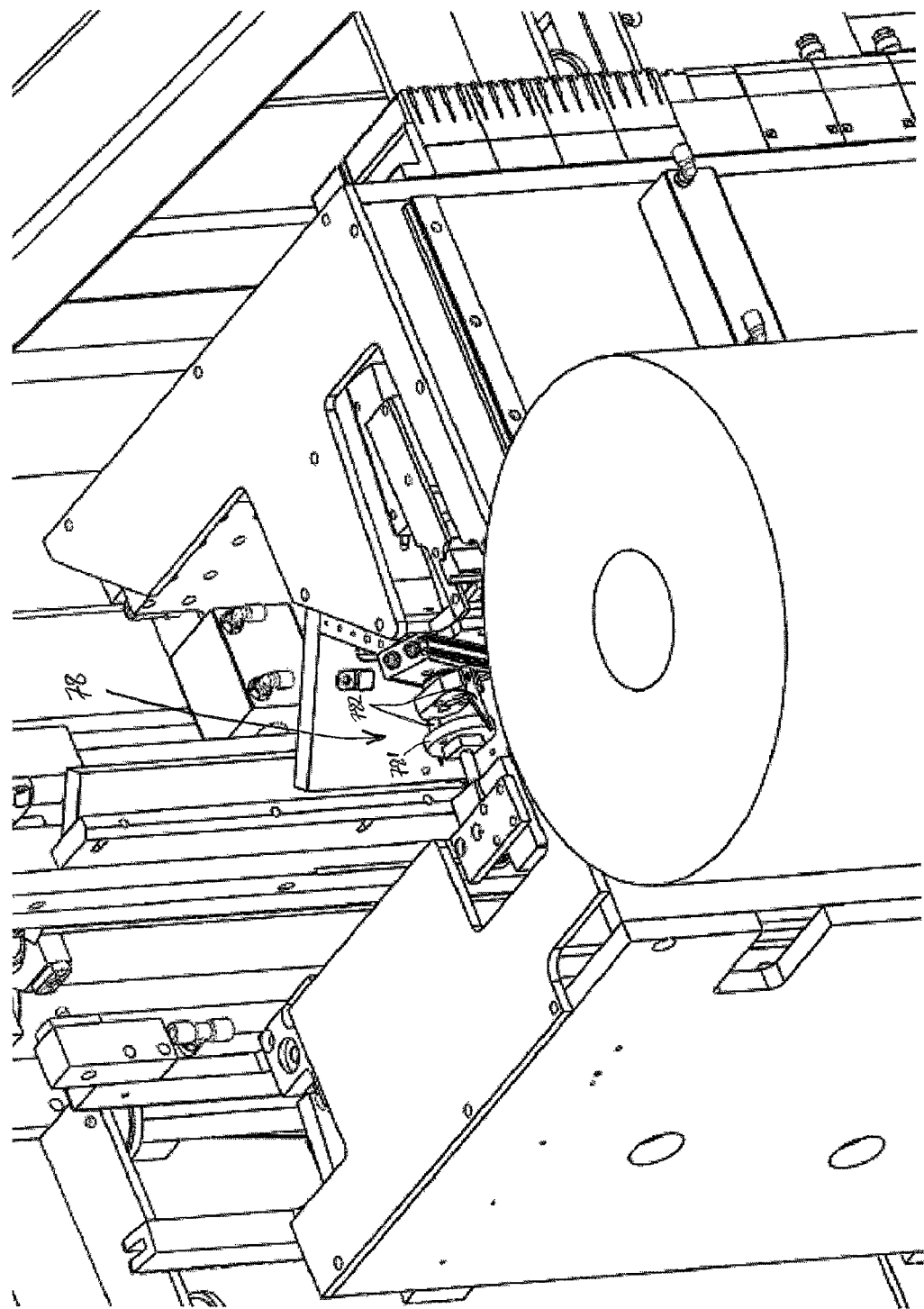
FIG. 7B is an enlarged, detailed view of a portion of the workstation shown in FIG. 7A, according to some embodiments.

FIG. 7A is a perspective view of workstation 700, according to some embodiments; and FIG. 7B is an enlarged, detailed view of a portion of the workstation 700, according to some embodiments. FIG. 7A illustrates a conveyer belt 72 for conveying first substrates, per arrow A, one at a time, past a film application work head 705 of workstation 700. First substrate 11 is shown being conveyed on conveyor belt 72 and supported in an upright orientation, by sets of rollers 722, which are positioned along a length of conveyer belt 72. The upright orientation of first substrate 11 is such that a pre-formed photovoltaic coating, for example, photovoltaic coating 400 (FIG. 4), which is adhered to a major surface of first substrate 11, faces work head 705 and extends from a first elevation E1 to a second elevation E2. FIG. 7A further illustrates a continuous roll of film 75 mounted, for example, on a spindle, in proximity to work head 705, so that work head 705 may draw discrete sections of the film, from roll 75, in order to apply each section over photovoltaic coating 400, of each first substrate 11, as coating 400 is conveyed past work head 705, and to separate each section from the remainder of the film. The film from roll 75 is a flexible and electrically non-conductive film, which, preferably, includes an adhesive backing, for example, and of the previously-described embodiments of film 405.

According to some preferred methods, an opening, for example, the previously-described feedthrough opening 480 (FIG. 3), is formed in each discrete section of the film in the midst of applying the section to photovoltaic coating 400. With reference to FIGS. 7A-B, workstation 700 is shown including a cutting tool 78, which is positioned between roll of film 75 and film application work head 705. FIG. 7B illustrates cutting tool 78 including a pair of blades 782 and a disk 781, the operation of which will be described in greater detail, below. According to some alternate methods, an opening may be pre-formed in each discrete section of the film prior to loading roll of film 75 into workstation 700.

FIGS. 8A-C make up a series of top-view schematics, which outline a method of operation of workstation 700. FIG. 8A illustrates a first terminal edge 81 of the film having been pulled away from roll 75, and a first edge 841 of photovoltaic coating 400 of first substrate 11 having been moved into proximity with first terminal edge 81 of the film, at a first position 1, for initial contact therewith. With reference back to FIG. 7A, in conjunction with FIG. 8A, continuous roll of film 75 is initially loaded into workstation 700, such that first terminal edge 81 extends between first and second elevations E1, E2, at first position 1, in order to be located for the initial contact with first substrate 11. With further reference to FIG. 7A, a width W of film is defined by first terminal edge 81, which, in FIGS. 8A-C, extends into the page. Arrow A, in FIG. 8A, indicates a generally horizontal direction in which substrate 11 and coating 400, being adhered thereto, are conveyed, from first position 1, to a second position 2, which is shown in FIG. 8B.

With reference to FIG. 8B, the movement of coating 400, to second position 2, draws a first portion 801 of the film into adhesive contact with coating 400. FIGS. 8A-B illustrate a pinch roller 851, which, in conjunction with conveyor belt 72 (FIG. 9A), drives substrate 11, per arrow A, to move coating 400; another roller 853 is shown supporting substrate 11, on an opposite side from pinch roller 851. FIG. 8B illustrates first edge 841 of coating 400 being held stationary at second position 2, while cutting tool 78 cuts an opening through a second portion 802 of the film, which second portion 802 extends from first portion 801 toward roll 75. With reference back to FIG. 7B, in conjunction with FIG. 8B, disk 781 of cutting tool 78 is moved toward the film and pair of blades 782, which are located on an opposite side of the film, in order to hold the film steady, while blades 782 rotate, to cut out the opening in second portion 802 of the film; a diameter of disk 781 preferably fits within a spacing between blades 782. According to some preferred embodiments, cutting tool 78 further includes a vacuum source connected to disk 781 for keeping the cut out portion of the film from falling; the vacuum may subsequently be released, as second portion 802 of the film is drawn alongside disk 781, so that the cut out portion may be stuck onto the facing surface of the film downstream of the opening.

With reference to FIG. 8C, after the opening is cut, first edge 841 of coating 400 is moved, again per arrow A, in the generally horizontal direction, to a third position 3, in order to draw second portion 802 of the film into adhesive contact with coating 400. The opening formed in second portion 802 should be approximately aligned with lead wires, for example, wires 407 (FIG. 5), of photovoltaic coating 400, in order to provide a feedthrough opening for the wires.

FIG. 8C illustrates another cutting tool 79, located within film application work head 705 to cut and, thereby, create a second terminal edge 82 of the film, which extends along the width W of the film (FIG. 7A); the cut separates a third portion 803 of the film from a remainder of the film on roll 75. Third portion of film 803 extends from second portion 802 and will be drawn into adhesive contact with coating 400, as a second edge 842 of coating 400, which is opposite first edge 841, is moved into proximity with first position 1.

Once third portion 803 of the film has been adhered to coating 400, the application of the film over coating 400 of first substrate 11 is complete so that the applied film generally corresponds to film 450 of the above-described embodiments, for example, a illustrated in FIGS. 4 and 5. As previously described, the film is adhered to photovoltaic coating 400 by means of an adhesive backing, which is preferably preformed on a surface of the film. The adhered film preferably covers an entirety of the photovoltaic coating on first substrate 11, while leaving enough of peripheral region 105 of surface 122 (FIG. 2) free for joining the first substrate to the second substrate, as previously described. However, according to some embodiments, the footprint of the adhered film may leave a portion of a perimeter of coating 400 uncovered.

Figure 9A:
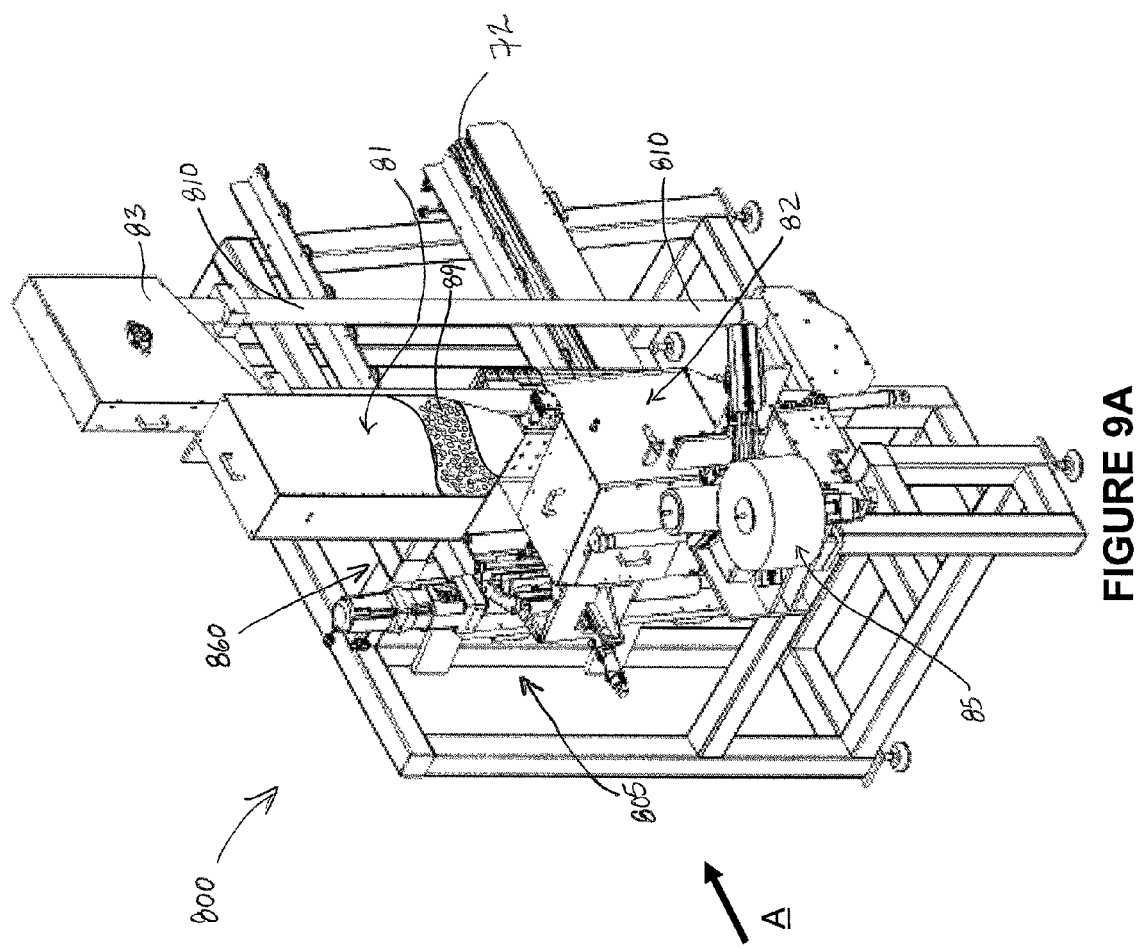
FIG. 9A is a perspective view of another workstation, which may be incorporated into the assembly line of FIG. 6, according to some embodiments of the present invention.

FIG. 9A is a perspective view, including a cut-away section, of workstation 800, according to some embodiments of the present invention; workstation 800 is adapted to both form and apply a desiccant sheet, for example, like desiccant sheet 490, to the exposed surface of the film of each first substrate, for example, film 450 of substrate 11, which is conveyed from workstation 700. FIG. 9A illustrates work station 800 including a desiccant bead applicator assembly 860 and a desiccant sheet application work head 805, which applies a discrete section of sheet-like material to each first substrate 11, in manner similar to that described, above, for each section from continuous roll of film 75, in workstation 700; a continuous roll of adhesive-backed sheet-like material 85, for example, mounted on a spindle, is shown positioned in proximity to a chamber 82 of applicator assembly 860. According to the illustrated embodiment, conveyor belt 72 conveys first substrates 11, from workstation 700, past desiccant sheet application work head 805; as each first substrate 11 passes work head 805, the corresponding discrete section of the sheet-like material, from continuous roll 85, which has been formed into a desiccant sheet by applicator assembly 860, is brought into adhesive contact with the surface of the film, for example, surface 45 of film 450, that overlays photovoltaic coating 400 of each first substrate 11. Some methods of the present invention integrate a surface treatment process into assembly line 60, for example, between workstations 700 and 800, in order to treat the surface of the film, for improved adhesion of the desiccant sheet thereto. The treatment process may be a plasma type, for example, a corona treatment, which raises the surface energy of the surface of the film. Equipment and methods suitable for such a surface treatment process are known to those skilled in the art.

FIG. 9A further illustrates desiccant bead applicator assembly 860 including a hopper 81, which holds and dispenses desiccant beads 89 (seen via the cut-away section through hopper 81), into chamber 82, which is positioned below hopper 81, to receive the dispensed beads 89, that fall, under the force of gravity, from hopper 81, for the application of the beads to the sections of the sheet-like material, as the sections pass through chamber 82. According to the illustrated embodiment, desiccant beads 89 that fall from hopper 81 into chamber 82, are deflected by a plurality of deflectors 822, which are shown in the view within chamber 82 of FIG. 9B. FIG. 9B illustrates deflectors 822 being formed as wedges, which are mounted to a plate 820, such that a deflection surface 832, of each deflector 822, is positioned below hopper 81 and slants downward, and away from plate 820. FIG. 9B further illustrates a rotating framework 825, which surrounds deflectors 822 and plate 820, and which includes spaced-apart struts 815, against which the adhesive-backed side of sheet-like material, from roll 85, is drawn, so as to bring each discrete section, of the adhesive-backed side, which spans a pair of adjacent struts 815, face-to-face with deflectors 822. The falling beads ricochet, being deflected laterally from surfaces 832, to bombard the facing adhesive surface of each section of the sheet-like material.

Figure 9C:
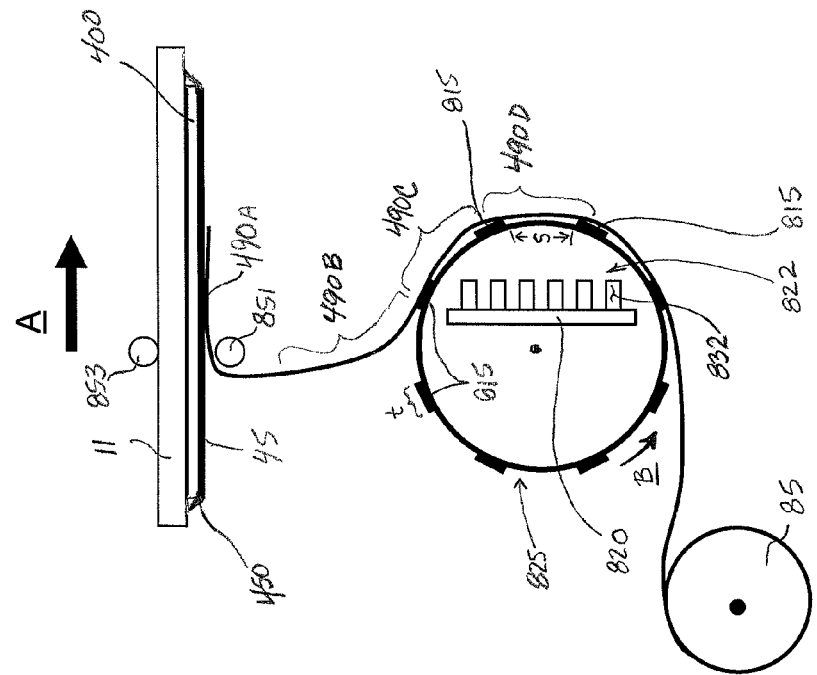
FIG. 9C is a top view schematic, which portrays an operation of the workstation shown in FIGS. 9A-B, according to some embodiments.
Figure 9B:
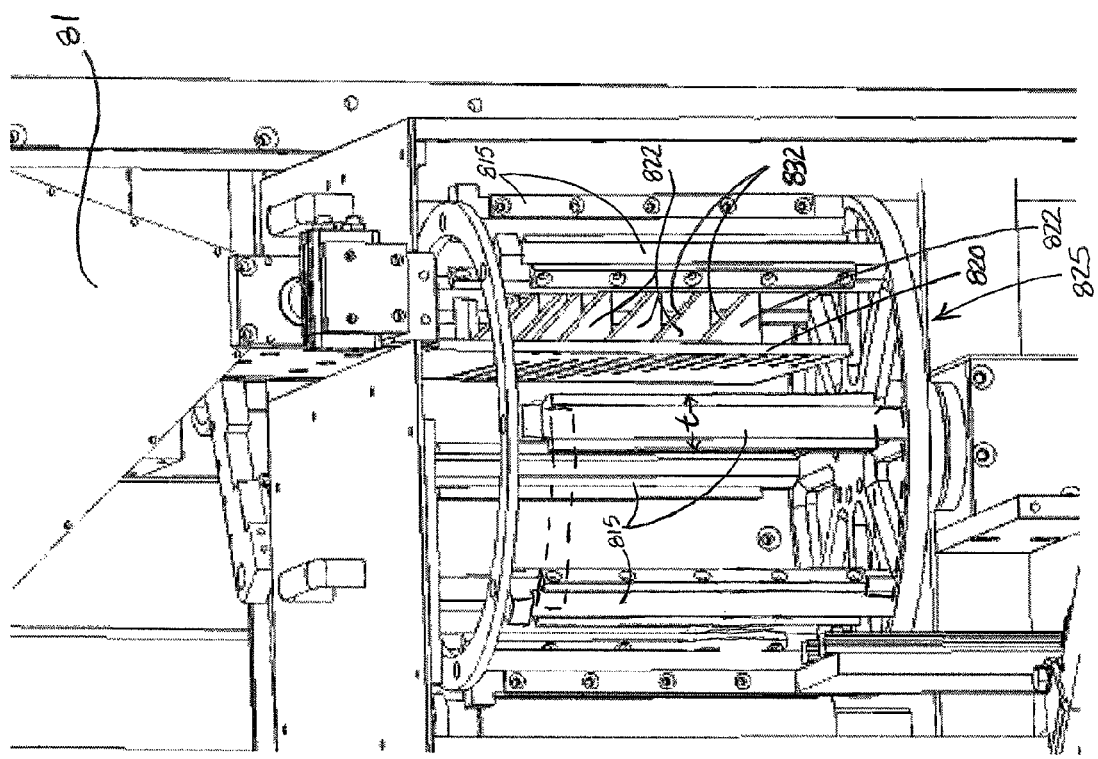
FIG. 9B is a view into a chamber of the workstation shown in FIG. 9A, according to some embodiments.

FIG. 9C is a top view schematic showing an exemplary path of the sheet-like material from roll 85, wherein each discrete section thereof, which is formed into a desiccant sheet 490A-D, is generally delineated. FIG. 9C illustrates the sheet-like material passing into contact with framework 825, which rotates, per arrow B, as the material is drawn through chamber 82, for example, by the movement, per arrow A of substrate 11, which may be driven by conveyor belt 72 (FIG. 9A) and pinch roller 851, as was previously described for workstation 700. According to some embodiments, framework 825 may be actively rotated, for example, via a coupling to a motor, to draw the sheet-like material, either as an alternative to the movement of substrate 11, or in addition thereto. In any case, the mechanism for drawing the sheet-like material, from continuous roll 85, into contact with framework 825 and, then, into adhesive contact with surface 45, preferably, should not stretch the material.

A spacing S between each pair of adjacent struts 815 of framework 825 effectively forms an aperture, through which desiccant beads, which have fallen from hopper 81, and which ricochet from surfaces 832 of deflectors 822, bombard the adhesive-backed side of the sheet-like material, to form each desiccant sheet 490A-D. With further reference to FIG. 9B-C, a thickness of each strut 815 serves to shield opposing peripheral portions of each section of the sheet-like material to keep these portions desiccant-free. Dashed lines in FIG. 9B indicate optional additional cross-members extending between each pair of adjacent struts 815; these cross-members may provide shielding of additional opposing peripheral portions of the adhesive-backed surface of each desiccant sheet 490A-D. Either extent of the desiccant-free portions may facilitate adhesion of sheets 490A-D to the corresponding surface 45 of film 450 of each first substrate 11, such that the adhered desiccant beads are held between surface 45 of film 450 and the corresponding section of sheet-like material.

Figure 10:
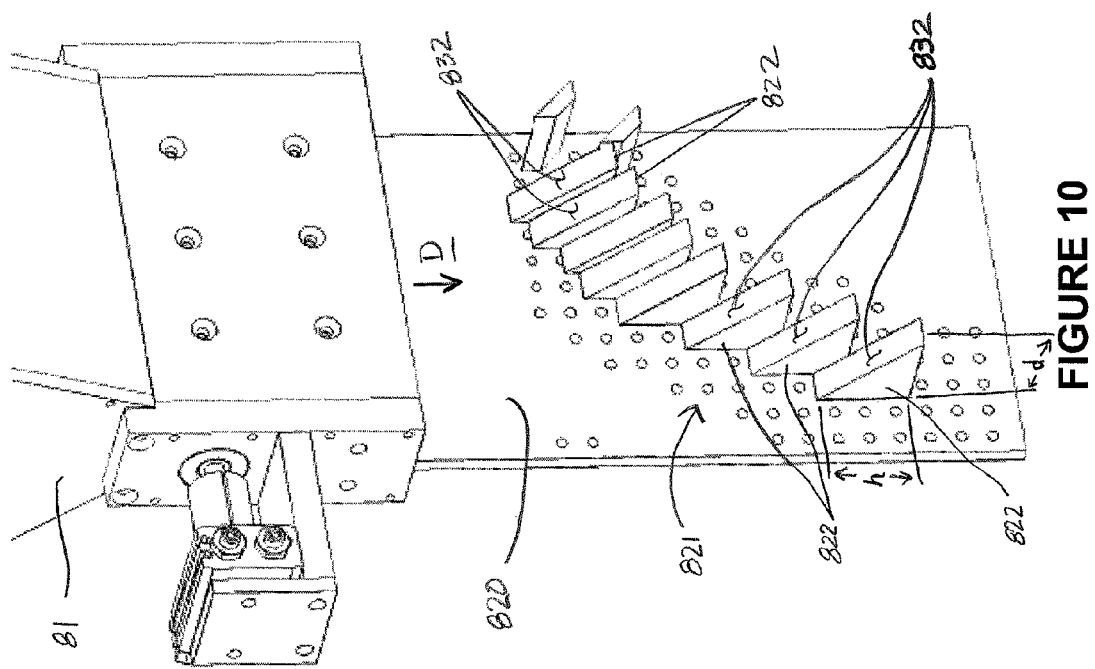
FIG. 10 is a perspective view of a portion of the workstation of FIG. 9A, separated from the rest of the workstation, according to some embodiments.

FIG. 10 is a perspective view of a portion of workstation 800, shown separated from the rest of workstation 800, according to some embodiments. FIG. 10 illustrates deflection surfaces 832, of deflectors 822, facing generally upward, toward hopper 81, so that the plurality of desiccant beads 89 (FIG. 9A) that fall from hopper 81, per arrow D, will ricochet off surfaces 832. FIG. 10 further illustrates plate 820 including a plurality of mounting features 821, which are formed by holes in the surface of plate 820, for the attachment of deflectors 822 to plate 820. According to the illustrated embodiment, each deflector 822 may include one or a number of threaded bores, for example, formed in a face thereof that is opposite deflection surface 832; the one or more bores may be sized to receive a mating threaded fastener that extends through features 821 of plate 820. Alternately, each deflector may include one or a number of protruding pegs, which extend therefrom, for example, along the face opposing deflection surface 832, and are sized to snuggly fit within mounting features 821. According to an exemplary embodiment, the wedges, which form deflectors 822, each have a thickness of approximately 0.5 inch, and a depth d and a height h of approximately 1.5 inch; the illustrated arrangement of deflectors 822 may be suitable for applying the aforementioned 50 grams of 3 A molecular sieve beaded desiccant, 0.8 mm to 1 mm in size, to the adhesive-backed surface of each desiccant sheet 490A-D (FIG. 9C), when a footprint of each sheet is approximately 180 square inches (1150 cm$^2$).

According to some preferred embodiments, the number, configuration and arrangement of features 821, of plate 820, and the aforementioned mating fasteners, or pegs, may allow for a re-arrangement of deflectors 822 along the surface of plate 820, within workstation 800. The ability to re-arrange deflectors 822 may provide a flexibility for workstation 800 to handle the application of a variety of types of desiccant beads, and/or to provide a variety of desiccant bead bombardment patterns according to particular moisture absorption requirements for various types of assemblies.

Referring back to FIG. 9A, a conduit 810 is shown extending, from below chamber 82, up to a bin 83, which is adjacent to, and in fluid communication with, hopper 81. According to the illustrated embodiment, an excess quantity of desiccant beads, which do not adhere to the adhesive surface of the sheet-like material, are re-circulated from chamber 82, through conduit 810, back to hopper 81. According to some embodiments, a series of disks, which are attached to a cable, that extends within conduit 810, are lifted by the cable, like elevators, to carry the beads up into bin 83; according to some alternate embodiments, a vacuum is applied within conduit 810, to draw the beads up into bin 83. Preferably, a filtering system is included in workstation 800, to prevent dust, that may be formed during bead re-circulation, from entering hopper 81.

It should be noted that alternative methods are contemplated for applying desiccant to each first substrate. For example, workstation 800 may be eliminated from assembly line 60, and desiccant bead applicator assembly 860 incorporated into workstation 700. According to this alternative, film from roll 75 may be adhesive-backed on both sides and drawn through assembly 860 so that the desiccant beads bombard one of the sides; then the film may be applied to the first substrate, for example, according to the method described above for workstation 700, so that the opposite side of the film adheres to the photovoltaic coating on the first substrate, and the side, to which the beads are adhered, faces outward from the coating. If workstation 800 remains in assembly line 60, it may simply function to apply a section of sheet-like material over the desiccant beads, that are adhered to outward-facing surface of the adhered film; otherwise the desiccant beads are left exposed within the airspace that is subsequently formed between the first substrate and the second substrate, when the two substrates are brought together.

Figure 11:
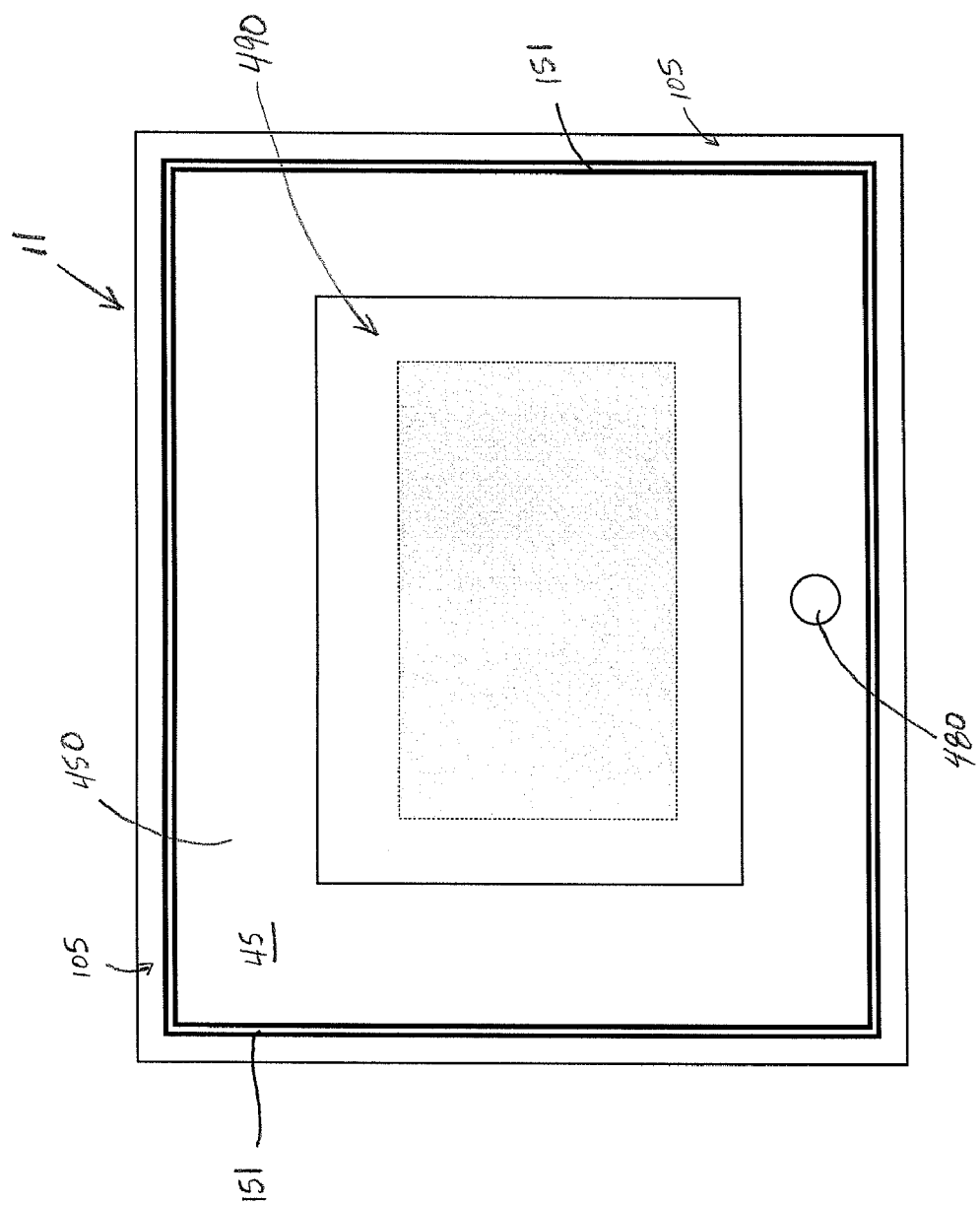
FIG. 11 is a plan view of a portion of a photovoltaic subassembly, according to some methods and embodiments of the present invention.

After desiccant is applied to first substrate 11, first substrate 11 is conveyed to workstation 900 (FIG. 6) for the application of a first member of a seal system, for example, first member 151 of seal system 150, described above; first member 151, which preferably serves as a spacer and a sealing member, is applied to peripheral region 105, of first substrate 11, which surrounds photovoltaic coating 400. FIG. 11 is a plan view of first substrate 11, upon application of first member 151 of seal system 150. According to some preferred methods, substrate 11 is conveyed, in the upright orientation, that is illustrated in FIG. 7A, on conveyer belt 72, into workstation 900 where member 151 is applied. Member 151 may be preformed, essentially in the shape shown in FIG. 11, prior to application thereof to substrate 11, or, preferably, extruded, for example, from a nozzle that is mounted in workstation 900.

After first member 151 is applied to first substrate 11, first substrate 11 is conveyed, preferably still in the same upright orientation, to station 950, where second substrate 12 is moved from station 925, into alignment with first substrate 11, as described above, in conjunction with FIG. 6. As was also described above, substrates 11, 12 are pressed together, for example, by confronting platens, such that member 151 joins the substrates, maintains an airspace therebetween, and seals the airspace.

FIG. 11 further illustrates feedthrough opening 480 in film 450, by which electrical lead wires 470 (FIG. 5) of photovoltaic coating 400 are accessed for coupling to a lead, for example, lead 420 (FIGS. 1, 3 and 4), as previously described. Once substrates 11, 12 are joined together, access to feedthrough opening 480 may be obtained, for example, through opening 18 (FIG. 1) in substrate 12, for the coupling of lead 420 to wires 460.

Finally, following the coupling, and other related operations that take place in workstations 1050, as described above, a second member of the seal system, for example, second member 152, is applied, at workstation 1250, within a channel, that is left between outer portions of the facing peripheral regions 105 of joined substrates 11, 12, to extend about an external perimeter of first member 151. Second member 152 provides additional adhesion and sealing between substrates 11, 12 and, as mentioned above, is preferably a silicone adhesive, for example, applied by a nozzle in workstation 1250, according to methods known to those skilled in the art. According to some alternate embodiments, as described above, only a single member is employed as a spacer and sealing member, so that workstation 1250 need not be included in assembly line 60, for these alternatives.

Although the substrates are described, above, as being conveyed and assembled together in an upright orientation, this need not be the case for every method and embodiment of the present invention. According to some alternate embodiments, one or both of each pair of substrates may be conveyed, for processing, in a more horizontal orientation, either at all of the workstations of the assembly line, or at only those workstations where a more horizontal orientation may be at least as suitable as the more upright orientation.

In the foregoing detailed description, the invention has been described with reference to specific methods and embodiments. However, it may be appreciated that various modifications and changes can be made without departing from the scope of the invention, as set forth in the appended claims.

We claim:

1. A method for manufacturing a photovoltaic subassembly, the method comprising:
    loading a continuous roll of flexible and non-electrically conductive film into a work station such that a first terminal edge of the film, which defines a width thereof, is pulled away from the roll and extends between a first elevation and a second elevation at a first position, the film having an adhesive backing;
    moving a first edge of a photovoltaic coating into proximity with the first position, such that the first terminal edge is approximately aligned with the first edge of the coating, for contact therewith, the photovoltaic coating being adhered to a central region of a major surface of a first substrate, the first substrate extending from the first elevation to the second elevation, and the first edge of the coating extending between the first and second elevations;
    moving, in a generally horizontal direction, the first edge of the photovoltaic coating, from the first position to a second position, in order to draw a first portion of the film into adhesive contact with the coating, the first portion extending from the first terminal edge of the film toward the roll;
    cutting an opening through a second portion of the film, when the first portion is in adhesive contact with the coating, the second portion extending from the second portion of the film toward the roll;
    moving, in the generally horizontal direction, the first edge of the photovoltaic coating, from the second position to a third position, in order to draw the second portion of the film into adhesive contact with the coating, such that the opening in the second portion is approximately aligned with lead wires of the photovoltaic coating;
    cutting along the width of the film, to separate a third portion of the film from a remainder of the film on the roll, the third portion extending from the second portion of the film to a second terminal edge of the film; and
    moving, in the generally horizontal direction, a second edge of the photovoltaic coating, which is opposite the first edge, into proximity with the first position, in order to draw the third portion of the film into adhesive contact with the coating, such that the second terminal edge of the film is approximately aligned with the second edge of the coating.

2. The method of claim 1, further comprising adhering a desiccant sheet to an exposed surface of the flexible and non-electrically conductive film, in between the first and second terminal edges thereof, after drawing the third portion of the film into adhesive contact with the coating.

3. The method of claim 2, further comprising forming the desiccant sheet by adhering a plurality of desiccant beads to an adhesive surface of a sheet material; and wherein adhering the desiccant sheet is accomplished by bringing the adhesive surface of the sheet material, with the plurality of desiccant beads adhered thereto, into adhesive contact with the exposed surface of the film.

4. The method of claim 2, further comprising applying a spacer member only to a peripheral region of the major surface of the first substrate, after adhering the desiccant sheet, the spacer member for joining a second substrate to the first substrate, in spaced relation thereto; and wherein the peripheral region surrounds a perimeter of the central region of the major surface.

5. The method of claim 1, further comprising applying a spacer member only to a peripheral region of the major surface of the first substrate, after drawing the third portion of the film into adhesive contact with the coating, the spacer member for joining a second substrate to the first substrate, in spaced relation thereto; and wherein the peripheral region surrounds a perimeter of the central region of the major surface.

6. The method of claim 5, further comprising:
    aligning a peripheral region of the second substrate with the peripheral region of the first substrate, the peripheral region of the second substrate surrounding a perimeter of a central region of a major surface of the second substrate; and
    pressing the first and second substrates together, with the spacer member sandwiched therebetween, to join the second substrate to the first substrate, such that the central regions of the major surfaces of the first and second substrates face one another and an airspace is maintained therebetween.

7. The method of claim 6, further comprising forming an opening through the second substrate, prior to pressing the first and second substrates together.

8. The method of claim 6, further comprising applying an adhesive member into an outer perimeter channel, after pressing the first and second substrates together, the outer perimeter channel being external to the spacer member and extending between the peripheral regions of the first and second substrates.

9. The method of claim 1, further comprising attaching the lead wires of the photovoltaic coating to a lead, after drawing the third portion of the film into adhesive contact with the coating.

10. A method for manufacturing a photovoltaic subassembly, the method comprising:
    adhering a flexible and non-electrically conductive film to a photovoltaic coating so as to cover a significant surface area of the coating, the coating being adhered to a central region of a major surface of a first substrate, and a perimeter of the central region being surrounded by a peripheral region of the major surface;
    adhering a plurality of desiccant beads to an adhesive surface of a section of sheet material; and adhering the adhesive surface of the section of sheet material, which has the desiccant beads adhered thereto, to an exposed surface of the adhered film, such that the adhesive surface faces the exposed surface of the film and the plurality of desiccant beads are held between the section of sheet material and the exposed surface of the film the method further comprising forming an opening in the film in the midst of adhering the film to the photovoltaic coating, and wherein the opening is aligned with lead wires of the photovoltaic coating, when the film is adhered.

11. The method of claim 10, further comprising attaching the lead wires of the photovoltaic coating to a lead, after adhering the adhesive surface of the section of sheet material.

12. The method of claim 10, further comprising:
drawing the section of sheet material from a continuous roll of sheet material such that the adhesive surface thereof comes face-to-face with a plurality of deflectors; and
wherein adhering the plurality of desiccant beads comprises allowing the plurality of desiccant beads to fall over the deflectors and ricochet therefrom to bombard the adhesive surface.

13. The method of claim 10, wherein adhering the plurality of desiccant beads comprises bombarding, with the plurality of desiccant beads, the adhesive surface of the section of sheet material.

14. The method of claim 10, further comprising shielding a portion of the adhesive surface of the sheet material, while adhering the plurality of desiccant beads, to prevent any of the plurality of desiccant beads from adhering to the portion.

15. A method for manufacturing a photovoltaic subassembly, the method comprising:
adhering a flexible and non-electrically conductive film to a photovoltaic coating so as to cover a significant surface area of the coating, the coating being adhered to a central region of a major surface of a first substrate, and a perimeter of the central region being surrounded by a peripheral region of the major surface;
adhering a plurality of desiccant beads to an adhesive surface of a section of sheet material; and
adhering the adhesive surface of the section of sheet material, which has the desiccant beads adhered thereto, to an exposed surface of the adhered film, such that the adhesive surface faces the exposed surface of the film and the plurality of desiccant beads are held between the section of sheet material and the exposed surface of the film
the method further comprising applying a spacer member only to the peripheral region of the major surface of the first substrate, after adhering the adhesive surface of the sheet material, the spacer member for joining a second substrate to the first substrate, in spaced relation thereto.

16. The method of claim 15, further comprising:
aligning a peripheral region of the second substrate with the peripheral region of the first substrate, the peripheral region of the second substrate surrounding a perimeter of a central region of a major surface of the second substrate; and
pressing the first and second substrates together, with the spacer member sandwiched therebetween, to join the second substrate to the first substrate, such that the central regions of the major surfaces of the first and second substrates face one another and an airspace is maintained therebetween.

17. The method of claim 16, further comprising forming an opening through the second substrate, prior to pressing the first and second substrates together.

18. The method of claim 16, further comprising applying an adhesive member into an outer perimeter channel, after pressing the first and second substrates together, the outer perimeter channel being external to the spacer member and extending between the peripheral regions of the first and second substrates.

19. A method for incorporating desiccant into each of a plurality of assemblies, each assembly including a first substrate having a major surface, the major surface including a central region over which a photovoltaic coating extends, and a peripheral region surrounding a perimeter of the photovoltaic coating, the method comprising:
allowing a plurality of desiccant beads to fall over a plurality of deflectors, the plurality of deflectors being arranged such that the falling beads ricochet laterally therefrom;
positioning an adhesive surface of sections of sheet material face-to-face with the deflectors, while the desiccant beads are falling, such that the ricocheting desiccant beads bombard the adhesive surfaces and adhere thereto;
adhering each of the sections of the sheet material, to which the desiccant beads are adhered, to a corresponding first substrate, such that the adhered desiccant beads of each section are positioned between the corresponding section of sheet material and the photovoltaic coating of the corresponding first substrate;
applying a spacer member only to the peripheral region of the major surface of each of the first substrates, after adhering the corresponding section of sheet material;
bringing each of a plurality of second substrates face-to-face with each corresponding first substrate, such that a peripheral region of each second substrate is aligned with the peripheral region of the corresponding first substrate, the peripheral region of each second substrate surrounding a central region thereof; and
joining each second substrate to the corresponding first substrate, by pressing the first and second substrates together, with the corresponding spacer member sandwiched therebetween, such that an airspace is maintained between each pair of first and second substrates.

20. The method of claim 19, further comprising adhering a section of flexible and electrically non-conductive film to each of the first substrates, before adhering the corresponding section of the sheet material, such that each section of flexible and electrically non-conductive film extends over a significant portion of the corresponding photovoltaic coating and includes an exposed surface to which the corresponding section of sheet material is adhered.

21. The method of claim 20, further comprising forming an opening in each section of film in the midst of adhering the corresponding section of film to the corresponding photovoltaic coating, and wherein each opening is aligned with lead wires of the corresponding photovoltaic coating, when the corresponding section of film is adhered.

22. The method of claim 19, further comprising shielding a portion of each adhesive surface of the sections of sheet material, when each section is face-to-face with the deflectors, and while the desiccant beads are falling, in order to prevent any of the ricocheting desiccant beads from adhering to the portion of each adhesive surface.

23. The method of claim 10, further comprising:
drawing the section of sheet material from a continuous roll of sheet material such that the adhesive surface thereof comes into contact with, and spans, a pair of spaced-apart struts of a rotating framework; and wherein adhering the plurality of desiccant beads comprises allowing the plurality of desiccant beads to bombard the adhesive surface of the section between the spaced-apart struts.

24. An assembly line for manufacturing photovoltaic assemblies, the assembly line comprising:
   a first workstation including a film application work head for adhering a flexible and electrically non-conductive film to each of a plurality of photovoltaic coatings, as each coating is conveyed past the film application work head, so as to cover a surface area of each coating, each coating being previously adhered to a central region of a major surface of a corresponding first substrate of a plurality of first substrates;
   a second workstation including a desiccant sheet application work head for adhering a sheet material, to which a plurality of desiccant beads have been previously adhered, to an exposed surface of the adhered film of each first substrate after each first substrate is conveyed to the second workstation, such that each plurality of desiccant beads is held against the exposed surface of each adhered film by the sheet material;
   a third workstation for applying a first member of a seal system along an inner portion of a peripheral region of the major surface of each first substrate, each peripheral region surrounding a perimeter of the central region of the corresponding first substrate;
   a fourth workstation for pressing a second substrate together with each first substrate, such that the applied first member of the seal system of each first substrate is sandwiched between the peripheral region of each first substrate and a peripheral region of a corresponding second substrate, and an air space is maintained between each pair of first and second substrates; and
   a fifth workstation for applying a second member of the seal system into an outer perimeter channel of each pressed together pair of first and second substrates, each outer perimeter channel being external to the corresponding first member of the seal system of each pressed together pair and extending along outer portions of the peripheral regions thereof.

25. The assembly line of claim 24, further comprising a conveyor belt and rollers configured to convey and to hold each of the plurality of first substrates in an upright orientation such that the major surface of each first substrate extends from a first elevation to a second elevation and faces the film application work head and the desiccant sheet application work head, in sequence, when the conveyor belt conveys each first substrate past the work heads, in sequence.

26. The assembly line of claim 24, wherein the third workstation is located downstream of the first and second workstations in the line.

27. The assembly line of claim 24, wherein:
   the first workstation further includes a spindle and a continuous roll of the flexible and electrically non-conductive film, the roll of film being mounted on the spindle, the film including an adhesive backing, and the spindle allowing the film to be drawn from the mounted roll; and
   the film application work head of the first workstation includes a pinch roller and a cutting tool, the pinch roller for driving each first substrate through the first workstation and thereby both draw the film from the mounted roll and adhere a section of the film to each photovoltaic coating, and the cutting tool for cutting each section of the film from a remainder of the film.

28. The assembly line of claim 27, wherein the first workstation further includes another cutting tool located between the spindle and the film application work head, the other cutting tool for cutting an opening through each section of the film before an entirety of each section is adhered to the corresponding photovoltaic coating.

29. The assembly line of claim 28, wherein:
   the other cutting tool of the first workstation includes a pair of blades and a disk, the blades and the disk being mounted opposite one another so that each section of the film is drawn between the blades and the disk;
   the disk is adapted to move into contact with each section of the film in order to support each section while the pair of blades cut the opening in each section; and
   the pair of blades are adapted to rotate in order to cut each opening about a perimeter of the disk.

30. The assembly line of claim 29, wherein the first workstation further includes a vacuum source connected to the disk so as to hold a cut out portion of the film from each opening.

31. The assembly line of claim 24, wherein:
   the second workstation further includes a spindle, a continuous roll of the sheet material and a desiccant bead applicator assembly, the roll of sheet material being mounted on the spindle, the sheet material including an adhesive backing, the spindle allowing for the sheet material to be drawn from the mounted roll, and the applicator assembly being located between the spindle and the desiccant sheet application work head and including a rotating framework formed, at least in part, by a plurality of spaced-apart struts; and
   one or both of the desiccant sheet application work head and the rotating framework are adapted to draw the sheet material from the mounted roll, such that sections of the sheet material span adjacent struts of the rotating framework to surround an inner area of the framework with the adhesive backing of each section facing inward toward the inner area; and
   the inner area of the rotating framework is adapted to receive a plurality of the pluralities of desiccant beads, such that, as each section spans adjacent struts of the framework, a corresponding plurality of desiccant beads adheres to each section.

32. An assembly line for manufacturing photovoltaic assemblies, the assembly line comprising:
   a first workstation including a film application work head, a cutting tool, a spindle, and a continuous roll of a flexible and electrically non-conductive film mounted on the spindle, the film including an adhesive backing and the spindle allowing the film to be drawn from the mounted roll, the film application work head including a pinch roller for driving each of a plurality of first substrates through the first workstation and to, thereby, both draw the film from the mounted roll and to adhere a section of the film to each of a plurality of photovoltaic coatings, so as to cover a surface area of each coating, each coating being previously adhered to a central region of a major surface of a corresponding first substrate of the plurality of first substrates, and the cutting tool being located between the spindle and the film application work head, the cutting tool for cutting an opening through each section of the film before an entirety of each section is adhered to the corresponding photovoltaic coating;
   a second workstation for applying a first member of a seal system along an inner portion of a peripheral region of the major surface of each first substrate, each peripheral region surrounding a perimeter of the central region of the corresponding first substrate;

a third workstation for pressing a second substrate together with each first substrate, such that the applied first member of the seal system of each first substrate is sandwiched between the peripheral region of each first substrate and a peripheral region of a corresponding second substrate, and an air space is maintained between each pair of first and second substrates; and a fourth workstation for applying a second member of the seal system into an outer perimeter channel of each pressed together pair of first and second substrates, each outer perimeter channel being external to the corresponding first member of the seal system of each pressed together pair and extending along outer portions of the peripheral regions thereof.

33. The assembly line of claim 32, wherein the film application work head of the first workstation further includes a cutting tool, the cutting tool of the application work head for cutting each section of the film from a remainder of the film.

34. The assembly line of claim 32, wherein:
the cutting tool of the first workstation includes a pair of blades and a disk, the blades and the disk being mounted opposite one another so that each section of the film is drawn between the blades and the disk;
the disk is adapted to move into contact with each section of the film in order to support each section while the pair of blades cut the opening in each section; and
the pair of blades are adapted to rotate in order to cut each opening about a perimeter of the disk.

35. The assembly line of claim 34, wherein the first workstation further includes a vacuum source connected to the disk so as to hold a cut out portion of the film from each opening.

36. The method of claim 6, wherein the spacer member is a seal system having a thickness t, so as to maintain said airspace, said thickness t being between 0.01 inch and 0.1 inch.

37. The method of claim 6, wherein the spacer member is a seal system having a thickness t, so as to maintain said airspace, said thickness t being approximately 0.04 inch.

38. The method of claim 36, wherein the seal system is formed at least in part from a polymer.

39. The method of claim 6, wherein said airspace is located between the second substrate and an exposed surface of the film adhered to the photovoltaic coating.

40. The method of claim 1, wherein the film has a thickness of between 0.001 inch and 0.015 inch.

41. The method of claim 1, wherein the film has a thickness of approximately 0.0035 inch.

42. The method of claim 40, wherein the film is formed of a polyethylene, polypropylene, or polyester material.

43. A method for manufacturing a photovoltaic subassembly, the method comprising:
loading a continuous roll of flexible and non-electrically conductive film into a work station such that a first terminal edge of the film, which defines a width thereof, is pulled away from the roll and extends between a first elevation and a second elevation at a first position, the film being formed of a polyethylene, polypropylene, or polyester material and having a thickness of between approximately 0.001 inch and approximately 0.015 inch and having an adhesive backing;
moving a first edge of a photovoltaic coating into proximity with the first position, such that the first terminal edge is approximately aligned with the first edge of the coating, for contact therewith, the photovoltaic coating being adhered to a central region of a major surface of a first substrate, the first substrate being light transmitting glass, the first substrate extending from the first elevation to the second elevation, and the first edge of the coating extending between the first and second elevations;
moving, in a generally horizontal direction, the first edge of the photovoltaic coating, from the first position to a second position, in order to draw a first portion of the film into adhesive contact with the coating, the first portion extending from the first terminal edge of the film toward the roll;
cutting an opening through a second portion of the film, when the first portion is in adhesive contact with the coating, the second portion extending from the second portion of the film toward the roll;
moving, in the generally horizontal direction, the first edge of the photovoltaic coating, from the second position to a third position, in order to draw the second portion of the film into adhesive contact with the coating, such that the opening in the second portion is approximately aligned with a lead wire location of the photovoltaic coating;
cutting along the width of the film, to separate a third portion of the film from a remainder of the film on the roll, the third portion extending from the second portion of the film to a second terminal edge of the film; and
moving, in the generally horizontal direction, a second edge of the photovoltaic coating, which is opposite the first edge, into proximity with the first position, in order to draw the third portion of the film into adhesive contact with the coating, such that the second terminal edge of the film is approximately aligned with the second edge of the coating.

* * * * *